United States Patent [19]
Ella

[11] Patent Number: 5,872,493
[45] Date of Patent: Feb. 16, 1999

[54] BULK ACOUSTIC WAVE (BAW) FILTER HAVING A TOP PORTION THAT INCLUDES A PROTECTIVE ACOUSTIC MIRROR

[75] Inventor: Juha Ella, Salo, Finland

[73] Assignee: Nokia Mobile Phones, Ltd., Salo, Finland

[21] Appl. No.: 816,702

[22] Filed: Mar. 13, 1997

[51] Int. Cl.$^6$ .............................. H03H 9/205; H03H 9/54
[52] U.S. Cl. .......................... 333/191; 333/192; 310/322; 310/324; 310/335; 310/348; 310/366
[58] Field of Search .................................... 333/186–192; 310/311, 321, 322, 326, 327, 340, 342, 348, 334, 366, 335

[56] References Cited

U.S. PATENT DOCUMENTS

| | | | |
|---|---|---|---|
| 3,173,100 | 3/1965 | White | 330/35 |
| 3,189,851 | 6/1965 | Fowler | 333/72 |
| 3,293,557 | 12/1966 | Denton | 330/4.6 |
| 3,486,046 | 12/1969 | Zalar | 310/8 |

(List continued on next page.)

FOREIGN PATENT DOCUMENTS

| | | |
|---|---|---|
| 0609555 | 8/1994 | European Pat. Off. . |
| 52-13793 | 2/1977 | Japan . |
| 62-76913 | 9/1987 | Japan . |
| 5-299970 | 12/1993 | Japan . |

OTHER PUBLICATIONS

"A monolithic piezoelectric amplitude modulator" Bransalov et al, International Journal of Electronics, vol. 47, No. 6, Dec. 1979, pp. 545–553.

"Ultralinear small–angle phase modulator" J. Lowe et al., Symposium on Frequency Control, 1991, pp. 645–648.

"Acoustic Bulk Wave Composite Resonators", K. Lakin, Appl. Phys. Lett. 38(3), 1 Feb. 1981, pp. 125–127.

"Systematic Design of Stacked–Crystal Filters by Microwave Network Methods", A. Ballato, IEEE Trans. Of Microwave Theory and Techniques, vol., MTT–22, No. 1, Jan., 1974, pp. 14–25.

"Multi–Layered Ultrasonic Transducers Employing Air–Gap Structure", S. Yoshimoto, IEEE Trans. Of Ultrasonic . . . vol. 42, No. 3, May, 1995, pp. 339–343.

"Design of Unapodized Surface Wave Transducers with Spectral Weighting", G. Nudd, IEEE Trans. On Microwave Theory and Techniques, vol. MTT–22, No. 1, Jan., 1974, pp. 14–23.

"Development of Miniature Filters for Wireless Applications", K. Lakin et al. , IEEE MTT–S Digest, 1995, pp. 883–886.

"Temperature Compensated High Coupling and High . . . Substrates", T. Shiosaki et al. , Ultrasonic Symposium, 1984, pp. 405–410.

"An Air–Gap Type Piezoelectric Composite Thin Film Resonator", H. Satoh et al. , IEEE, 1985, pp. 36–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE, pp. 1305–1309, 1965.

"Recent Advances in Monolithic Film Resonator Technology" M.M. Driscoll, IEEE Ultrasonics Symposium, 1986, pp. 365–369.

"Thin Film Bulk Acoustic Wave Filters for GPS", K.M. Lakin, IEEE Ultrasonics Symposium, 1992, pp. 471–476.

Primary Examiner—Robert Pascal
Assistant Examiner—Barbara Summons
Attorney, Agent, or Firm—Perman & Green, LLP

[57] ABSTRACT

A Bulk Acoustic Wave (BAW) filter, comprising at least one resonator structure that is disposed over a substrate, and an acoustic mirror that is disposed over the resonator structure. The acoustic mirror includes a plurality of layers. The acoustic mirror substantially isolates acoustic vibrations produced by the resonator from reaching beyond an upper surface of the acoustic mirror. The acoustic mirror also prevents environmental contaminants from coming into contact with the resonator. Also disclosed are surface-mountable BAW components.

46 Claims, 17 Drawing Sheets

5,872,493
Page 2

U.S. PATENT DOCUMENTS

| | | | |
|---|---|---|---|
| 3,568,108 | 3/1971 | Poirier et al. | 333/187 |
| 3,686,579 | 8/1972 | Everett | 330/5.5 |
| 3,696,312 | 10/1972 | Kuhn et al. | 333/24 R |
| 3,760,471 | 9/1973 | Borner | 29/25.35 |
| 3,764,928 | 10/1973 | Gires et al. | 330/5.5 |
| 3,916,490 | 11/1975 | Sheahan et al. | 29/25.35 |
| 3,924,312 | 12/1975 | Coussot et al. | 29/25.35 |
| 4,019,181 | 4/1977 | Olsson et al. | 343/6.555 |
| 4,166,967 | 9/1979 | Benes et al. | 310/322 X |
| 4,320,365 | 3/1982 | Black et al. | 333/187 |
| 4,365,216 | 12/1982 | Minagawa et al. | 333/153 |
| 4,418,299 | 11/1983 | Momosaki | 310/361 |
| 4,456,850 | 6/1984 | Inoue et al. | 310/304 |
| 4,502,932 | 3/1985 | Kline et al. | 204/192 EC |
| 4,556,812 | 12/1985 | Kline et al. | 310/324 |
| 4,562,370 | 12/1985 | Von Dach | 310/324 |
| 4,642,508 | 2/1987 | Suzuki et al. | 310/321 |
| 4,897,618 | 1/1990 | Svetanoff | 331/76 |
| 5,153,476 | 10/1992 | Kosinski | 310/313 R |
| 5,162,691 | 11/1992 | Mariani et al. | 310/321 |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,294,898 | 3/1994 | Dworsky et al. | 333/187 |
| 5,332,943 | 7/1994 | Bhardwaj | 310/326 |
| 5,373,268 | 12/1994 | Dworsky et al. | 333/187 |
| 5,382,930 | 1/1995 | Stokes et al. | 333/191 |
| 5,422,533 | 6/1995 | Kosinski et al. | 310/311 X |
| 5,446,306 | 8/1995 | Stokes et al. | 257/416 |
| 5,587,620 | 12/1996 | Ruby et al. | 310/346 |
| 5,596,239 | 1/1997 | Dydyk | 310/311 |
| 5,629,906 | 5/1997 | Sudol et al. | 367/162 |
| 5,646,583 | 7/1997 | Seabury et al. | 333/187 |
| 5,692,279 | 12/1997 | Mang et al. | 310/366 X |

BULK ACOUSTIC WAVE (BAW) FILTER HAVING A TOP PORTION THAT INCLUDES A PROTECTIVE ACOUSTIC MIRROR

FIELD OF THE INVENTION

The present invention relates to Bulk Acoustic Wave (BAW) filters and, in particular, the invention relates to BAW filters having acoustic mirrors.

BACKGROUND OF THE INVENTION

It is known in the art to use Surface Mount Technology (SMT) to assemble integrated circuits. The performance of this technology involves various steps including, by example, the application of solder cream to a substrate, the placement of circuit components on the substrate, soldering, and cleaning. During the performance of these steps, the circuit components often need to be protected from, by example, solder, solvents, or other types of materials that can contaminate these components during the assembly process.

The need for using miniature and high performance filters in wireless communication devices has led to the widespread usage of Surface Acoustic Wave (SAW) filters. As is known by those having skill in the art, layer surfaces of SAW filters typically need to be protected from external contaminants during assembly and subsequent use. One known method of protecting these layer surfaces during assembly includes assembling the filters using, for example, flip-chip technology in a hermetic environment. As can be appreciated, this technique can be tedious to perform.

Another known method of protecting layer surfaces of SAW filters includes packaging the SAW filters in hermetically sealed ceramic packages. After being packaged in this manner, the SAW filters can then be surface mounted to a circuit board. Unfortunately, this technique tends to be expensive, as packaging costs can contribute considerably to overall fabrication costs.

Fortunately, the drawbacks associated with using hermetically sealed ceramic packaging and/or hermetic environments can be avoided by using another type of high performance acoustic filter, namely a Bulk Acoustic Wave (BAW) filter. BAW filters typically include several BAW resonators. In a BAW filter, acoustic waves propagate in a direction that is perpendicular to the filter's layer surfaces. In contrast, acoustic waves which propagate within a SAW filter do so in a direction that is parallel to the layer surfaces of the filter. As a result, and as may be appreciated by those who are skilled in the art, the performance of a SAW filter is likely to be more detrimentally effected when its layer surfaces are contaminated or otherwise impaired by external elements than would be the performance of a BAW filter that experiences similar contamination.

BAW filters can be fabricated to include various known types of BAW resonators. These known types of BAW resonators comprise three basic portions. A first one of the portions, which is used to generate acoustic waves, includes an acoustically-active piezoelectric layer. This layer may comprise, by example, zinc-oxide (ZnO), aluminum nitride (AlN), zinc-sulfur (ZnS), or any other suitable piezoelectric material that can be fabricated as a thin film. A second one of the portions includes electrodes that are formed on opposite sides of the piezoelectric layer. A third portion of the BAW resonator includes a mechanism for acoustically isolating the substrate from vibrations produced by the piezoelectric layer. BAW resonators are typically fabricated on silicon, gallium arsenide, or glass substrates using thin film technology (e.g., sputtering, chemical vapor deposition, etc.). BAW resonators exhibit series and parallel resonances that are similar to those of, by example, crystal resonators. Resonant frequencies of BAW resonators can typically range from about 0.5 GH to 5 GHz, depending on the layer thicknesses of the devices.

As can be appreciated by those who are skilled in the art, at least some of the layers that form BAW filters may be exposed to the air. If a contaminating or otherwise harmful external material comes into contact with any of these layers, the performance of the BAW filters can become degraded. In order to avoid this problem, these layers are typically protected using a semi-hermetic packaging. Unfortunately, the costs of using semi-hermetic packaging can be high. Thus, it would be desirable to provide a novel, inexpensive technique for protecting these surfaces. It would also be desirable to fabricate BAW filters in a manner so as to provide interfaces for reflecting acoustic waves that replace the layer and air interfaces of known types of BAW filters.

OBJECTS OF THE INVENTION

It is an object of this invention to provide an inexpensive method for protecting resonator layers of Bulk Acoustic Wave (BAW) filters from being exposed to materials which can contaminate or otherwise detrimentally affect these layers.

It is another object of this invention to provide a protective layer for reflecting acoustic waves emanating from within a BAW filter in such a manner that the acoustic waves do not propagate beyond the protective layer.

It is another object of this invention to provide a surface-mountable BAW device.

Further objects and advantages of this invention will become apparent from a consideration of the drawings and ensuing description.

SUMMARY OF THE INVENTION

The foregoing and other problems are overcome and the objects of the invention are realized by a Bulk Acoustic Wave (BAW) filter having a top portion that includes a protective acoustic mirror that is constructed in accordance with the invention.

In accordance with one embodiment of the invention, the BAW filter comprises a substrate and a first acoustic mirror which is disposed over the substrate. In this embodiment, a plurality of resonators are disposed adjacent to one another on a surface of the first acoustic mirror. A second acoustic mirror is disposed on the plurality of resonators, and a protective passivation layer is situated atop the second acoustic mirror.

The second acoustic mirror comprises three layers, namely a top layer, a middle layer, and a bottom layer. Each of these layers has a thickness that is, by example, approximately equal to one-quarter wavelength. The top layer and the bottom layer are preferably comprised of materials having low acoustic impedances such as, by example, silicon (Si), poly-silicon, aluminum (Al), or a polymer. The middle layer is preferably comprised of a material that has a high acoustic impedance such as, by example, gold (Au), molybdenum (Mo), or tungsten (W). The protective passivation layer may be comprised of silicon-dioxide ($SiO_2$), epoxy, a "glop top" material (e.g., an epoxy-based viscous fluid which hardens after being heated), or any other suitable protective material.

The plurality of resonators are BAW resonators. Each of the resonators comprises a first, bottom electrode that is situated over the first acoustic mirror, a piezoelectric layer that is situated over the bottom electrode and over a respective portion of the first acoustic mirror, and a second, top electrode that is formed over portions of the piezoelectric layer and over a respective portion of the first acoustic mirror. A portion of the top electrode of a first one of the resonators is exposed to provide a first contact pad. Similarly, a portion of the top electrode of a second one of the resonators is exposed to provide a second contact pad. According to one embodiment of the invention, one or more grounding pads are also be provided, and are disposed on the first acoustic mirror. The grounding pads are electrically coupled to the top electrode of a third one of the resonators and to the bottom electrode of a fourth one of the resonators. Also in this embodiment of the invention, the bottom electrode of the first resonator is electrically coupled to the bottom electrode of each of the second and third resonators, and the top electrode of the fourth resonator is coupled to the top electrode of the second resonator.

According to another embodiment of the invention, the second acoustic mirror fully covers a top surface of the top electrode of each BAW resonator, and no exposed contact pads are provided in the BAW filter. The BAW filter of this embodiment includes contacts (i.e., electrodes) that are formed on an external surface of the BAW filter. In accordance with a preferred embodiment of the invention, one contact is electrically coupled to the top electrode of the first resonator, another contact is electrically coupled to the top electrode of the second resonator, and another contact is electrically coupled to the top electrode of the third resonator and to the bottom electrode of the fourth resonator. In another embodiment of the invention, an additional contact is provided which is also electrically coupled to the top electrode of the third resonator and to the bottom electrode of the fourth resonator. The contacts enable the BAW filter to be electrically coupled to an external circuit, and further enable the BAW filter to be surface mounted to a wiring substrate.

According to another embodiment of the invention, a BAW filter is provided that has a stacked crystal structure. This type of filter is referred to as a Stacked Crystal Filter (SCF). The SCF includes a substrate, a first, bottom acoustic mirror, a second, top acoustic mirror, and a protective passivation layer, that are similar to those described above. The SCF also comprises a first, bottom resonator, and a second, top resonator. The bottom resonator is disposed over the bottom acoustic mirror. The top resonator is disposed over the first resonator, thereby forming a resonator stack. The first, bottom resonator includes a piezoelectric layer, a lower electrode, and a ground electrode. The piezoelectric layer is located between portions of the ground electrode and the lower electrode. The second, top resonator includes the ground electrode, a piezoelectric layer, and an upper electrode. The piezoelectric layer is disposed between portions of the ground electrode and the upper electrode. The piezoelectric layers and the electrodes comprise similar materials and have similar thicknesses as those described above.

In one embodiment of the invention, the second acoustic mirror and the protective passivation layers do not cover portions of the electrodes of the SCF, and the exposed portions of these electrodes provide contact pads. In another embodiment of the invention, the second acoustic mirror fully covers these electrodes, and contacts are provided on an external surface of the SCF structure, enabling the SCF to be coupled to an external circuit or surface mounted to a wiring substrate.

The use of a second acoustic mirror within a BAW filter offers a number of advantages over prior art filters. By example, the second acoustic mirror of the present invention reflects acoustic waves produced by the piezoelectric layers in such a manner that these waves do not propagate to an upper surface of the second acoustic mirror. Thus, for a case in which some material is in contact with the protective passivation layer, the reflected acoustic waves do not reach the material. Another advantage of employing the second acoustic mirror is that it prevents contaminants from coming into contact with the layers of the resonators. Furthermore, the cost of fabricating BAW resonators to include second acoustic mirrors is typically significantly less than the cost of employing known techniques for protecting resonator layers, such as semi-hermetic packaging.

In accordance with another aspect of the invention, a method is provided for fabricating a BAW filter and assembling it on a circuit board. The method includes the steps of: (A) forming a first, bottom acoustic mirror on a substrate, and (B) forming at least one resonator on the bottom acoustic mirror. The at least one resonator may include, by example, a plurality of adjacent resonators disposed over a surface of the bottom acoustic mirror, or a pair stacked resonators forming a stacked crystal structure. Contact pads may also be formed from portions of electrodes of the resonators to provide input, output, and grounding pads. A next step (C) includes forming a top acoustic mirror over the at least one resonator. The top acoustic mirror is similar to the second acoustic mirror described above.

The method further includes the steps of (D) forming a protective passivation layer over the top layer of the top acoustic mirror, and patterning the layers formed in steps (C) and (D) to create openings for the contact pads, if any are provided. The protective passivation layer and the contact pads are also similar to those described above. Thereafter, a step (E) is performed of assembling the filter on a circuit board using a selected technique. Where the assembly technique selected is an on-board assembly technique, steps (F1) and (F2) are performed. In step (F1), the wafer is cut into chips. In step (F2), the chips are coupled to circuitry of a circuit board with bonding wires.

For a case in which the assembly technique selected at block (E) is flip-chip technology, steps (G1) and (G2) are performed. In step (G1), solder bumps are fabricated on contact pads of the filter using, by example, vacuum deposition (e.g., evaporation) of a bump metal or electrochemical plating of solder. The wafer is then cut into chips. Thereafter, at block (G2), the chips are coupled to selected contacts of the circuit board using flip-chip technology. For a case wherein the assembly technique selected at block (E) is surface mount technology, steps (H1) and (H2) are performed. In step (H1), the wafer is cut into chips and contacts are formed over an external surface of the filter. Thereafter, at step (H2), the chips are coupled to selected circuit board contact pads using surface mount technology.

BRIEF DESCRIPTION OF THE DRAWINGS

The above set forth and other features of the invention are made more apparent in the ensuing Detailed Description of the Invention when read in conjunction with the attached Drawings, wherein:

FIG. 13c shows a cross-section of the Stacked Crystal Filter of FIG. 13a, taken along lines 13c—13c of FIG. 13a.

Identically labeled elements appearing in different ones of the figures refer to the same element but may not be referenced in the description for all figures.

DETAILED DESCRIPTION OF THE INVENTION

Before describing the presently preferred embodiments of this invention, a brief reference will be made to the Bulk Acoustic Wave (BAW) devices shown in FIGS. 1–6a, which are further described in a commonly assigned copending U.S. patent application entitled "A Device Incorporating a Tunable Thin Film Bulk Acoustic Resonator for Performing Amplitude and Phase Modulation", filed on Oct. 2, 1996, by Juha Ellä.

Figure 2:
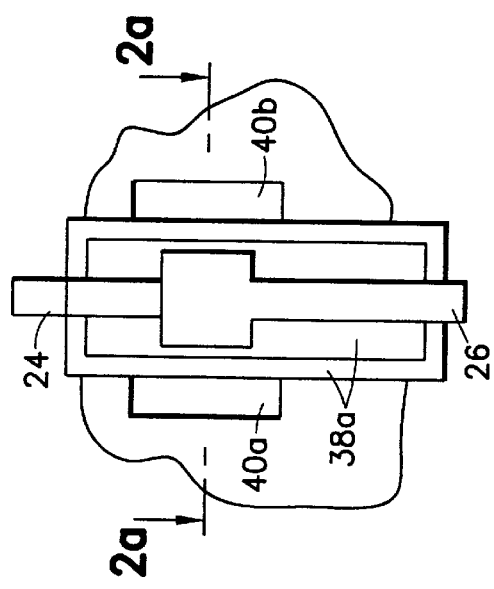
FIG. 2 illustrates a top view of the BAW resonator of FIG. 1.
Figure 1:
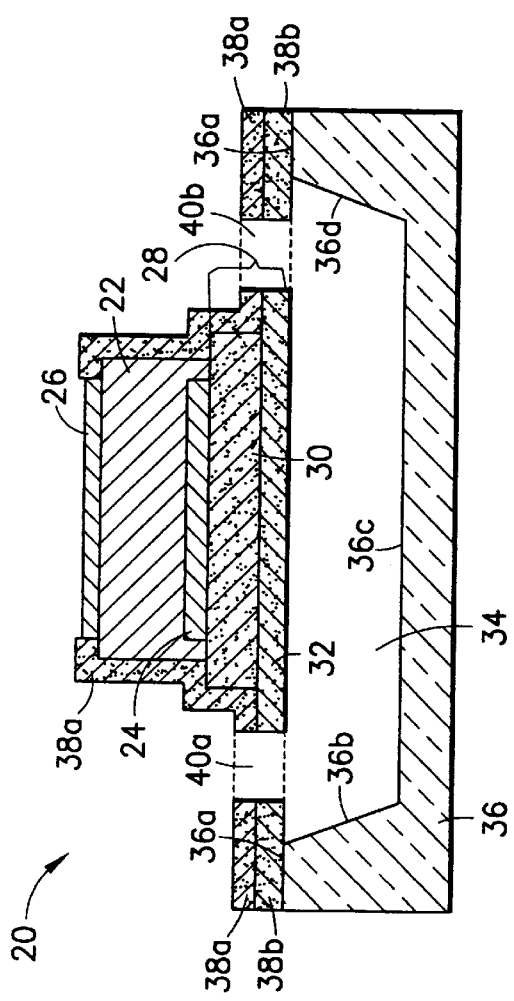
FIG. 1 illustrates a cross-section of an exemplary Bulk Acoustic Wave (BAW) resonator that includes a membrane and an air gap.

In FIGS. 1 and 2, a cross-section (side view) and a top view, respectively, are shown of a BAW resonator 20 having a membrane or bridge structure 28. The BAW resonator 20 comprises a piezoelectric layer 22, a first protective layer 38b, a second protective layer 38a, a first electrode 24, a second electrode 26, the membrane 28, etch windows 40a and 40b, an air gap 34, and a substrate 36. The piezoelectric layer 22 comprises, by example, a piezoelectric material that can be fabricated as a thin film such as, by example, zinc-oxide (ZnO), or aluminum-nitride (AlN). The membrane 28 comprises two layers, namely, a top layer 30 and a bottom layer 32. The top layer 30 is comprised of, by example, poly-silicon (poly-si) or aluminum-nitride (AlN), and the bottom layer 32 is comprised of, by example, silicon-dioxide ($SiO_2$) or gallium arsenide (GaAs). The substrate 36 is comprised of a material such as, by example, silicon (Si), $SiO_2$, GaAs, or glass. Through the etch windows 40a and 40b, a portion of the substrate 36 is etched to form the air gap 34 after the membrane layers have been deposited over the substrate 36.

Figure 5:
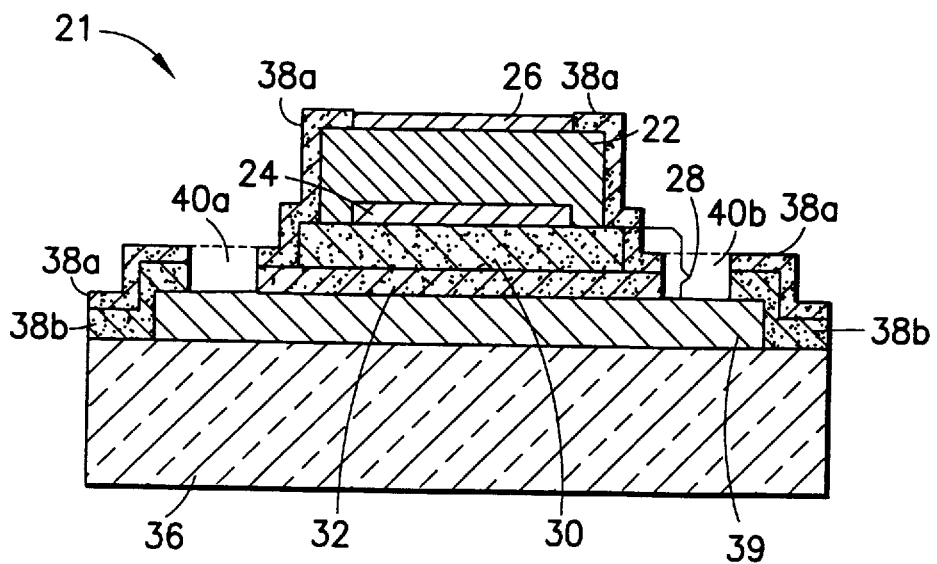
FIG. 5 illustrates a cross-section of an exemplary BAW resonator that includes a sacrificial layer.

Referring to FIG. 5, a BAW resonator 21 is shown. The BAW resonator 21 is similar to the one illustrated in FIG. 1, with an addition of a sacrificial layer 39. During fabrication of the resonator 21, the sacrificial layer 39 is deposited over the substrate 36 prior to the deposition of the membrane 28. After all of the resonator layers are formed, the sacrificial layer 39 is removed through the etch windows 40a and 40b to form air gap 34.

For both of the resonators 20 and 21, the piezoelectric layer 22 produces vibrations in response to a voltage being applied across the electrodes 24 and 26. The vibrations that reach the interface between the membrane 28 and the air gap 34 are reflected by this interface back into the membrane 28. In this manner, the air gap 34 isolates vibrations produced by the piezoelectric layer 22 from the substrate 36.

Figure 6A:
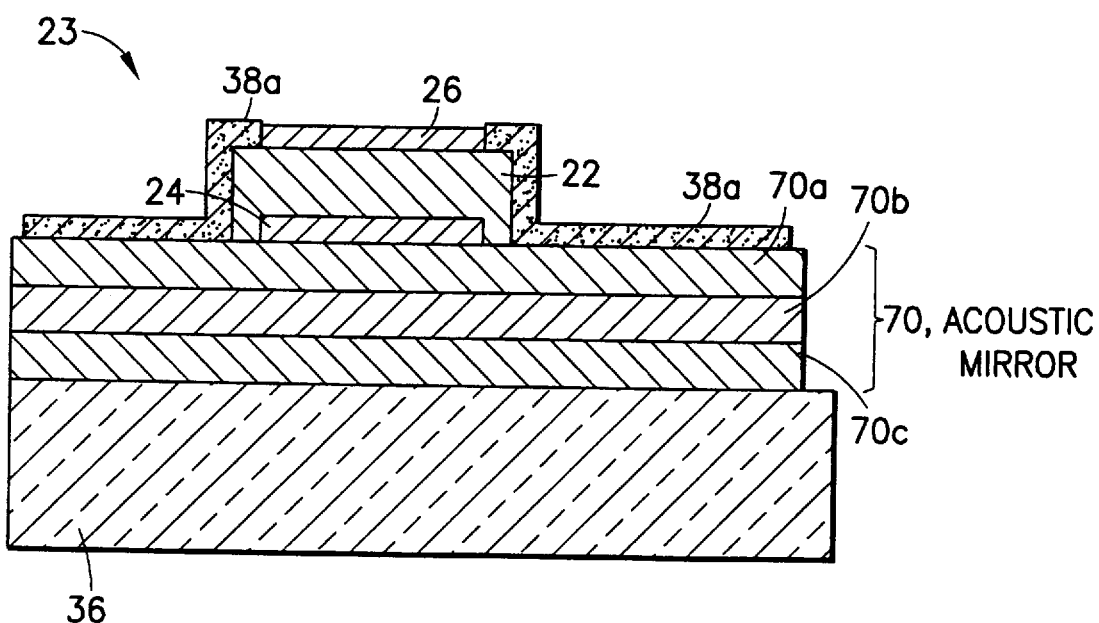
FIG. 6a illustrates a cross-section of an exemplary BAW resonator that includes an acoustic mirror.

In FIG. 6a, another BAW resonator 23 is shown. This resonator 23 has a similar structure as that of the BAW resonator 21 of FIG. 1, except that only a single protective layer 38a is provided, and the membrane 28 and the air gap 34 are replaced with an acoustic mirror 70 which acoustically isolates vibrations produced by the piezoelectric layer 22 from the substrate 36.

The acoustic mirror 70 preferably comprises an odd number of layers (e.g., from three to nine layers). The acoustic mirror 70 shown in FIG. 6a comprises three layers, namely a top layer 70a, a middle layer 70b, and a bottom layer 70c. Each layer 70a, 70b and 70c has a thickness that is, by example, approximately equal to one quarter wavelength. The top layer 70a and bottom layer 70c are comprised of materials having low acoustic impedances such as, by example, silicon (Si), poly-silicon, aluminum (Al), or a polymer. Also, the middle layer 70b is comprised of a material having a high acoustic impedance such as, by example, gold (Au), molybdenum (Mo), or tungsten (W). A ratio of the acoustic impedances of consecutive layers is large enough to permit the impedance of the substrate to be transformed to a lower value. As a result, the substrate 36 may be comprised of various high acoustic impedance materials or low acoustic impedance materials (e.g., Si, $SiO_2$, GaAs, glass, or a ceramic material).

Figure 6B:
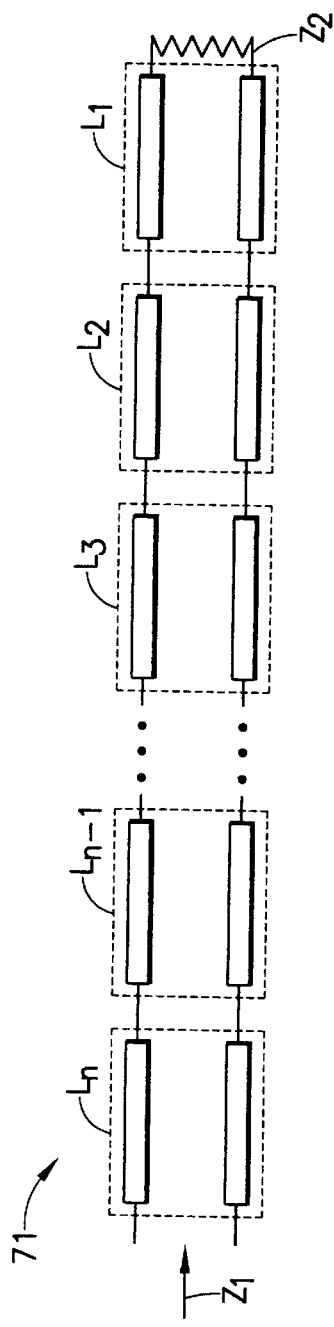
FIG. 6b shows high and low impedance transmission lines representing layer impedances of an acoustic mirror of the invention.

The manner in which the ratio of the acoustic impedances of consecutive layers permit the substrate impedance to be transformed to a lower value may be understood in view of FIG. 6b, which shows an exemplary structure 71 that models layers of an acoustic mirror. The structure 71 includes a number of sets of high and low impedance transmission lines $L_1$, $L_2$, $L_3$ . . . $L_{n-1}$ and $L_n$ that have impedances representing those of acoustic mirror layers. Each transmission line is one-quarter wavelength long. The sets of transmission lines $L_1$ and $L_3$ have low impedances and represent, by example, the bottom layer 70c and the top layer 70a, respectively, or vice versa, of the acoustic mirror 70. The transmission lines of set $L_2$ have high impedances and represent, by example, the middle layer 70b of the acoustic mirror 70. A load impedance $Z_2$ is also shown which represents the impedance of the substrate 36. Transmission lines of set $L_{n-1}$ and $L_n$ are also included in FIG. 6b, and represent layers for a case in which more than three layers are included within the acoustic mirror 70. The label "n" represents an even number. A ratio of the acoustic impedances of adjacent sets of transmissions lines (e.g., consecutive layers) is large enough to transform the load impedance $Z_2$ to a minimum impedance $Z_1$, which represents an impedance at an interface between the electrode 24 and the top layer 70a of the acoustic mirror 70. In a case in which this ratio is small, however, additional layers are needed to transform the load impedance $Z_2$ to a minimum impedance.

Referring again to the device 23 of FIG. 6a, when the piezoelectric layer 22 vibrates, the vibrations it produces are substantially isolated from the substrate 36 by the interface between the electrode 24 and the top layer 70a.

It should be noted that, although the acoustic mirror 70 preferably comprises an odd number of layers, an even number of layers can also be employed in certain cases. For example, one or more adhesive layers may be employed between the bottom electrode 24 and the top layer 70a, and/or between the substrate 36 and the bottom layer 70c, in order to securely adhere these layers to one another. The adhesive layers may be formed of any suitable adhesive material. As can be appreciated by those skilled in the art, the particular adhesive material used in the device depends on various factors such as, for example, the thicknesses of the layers surrounding the adhesive layers, the types of materials included within the surrounding layers, the type of deposition process used to fabricate the surrounding layers, and the environmental conditions (e.g., temperature) present during the deposition of the piezoelectric layer 22.

Figure 3:
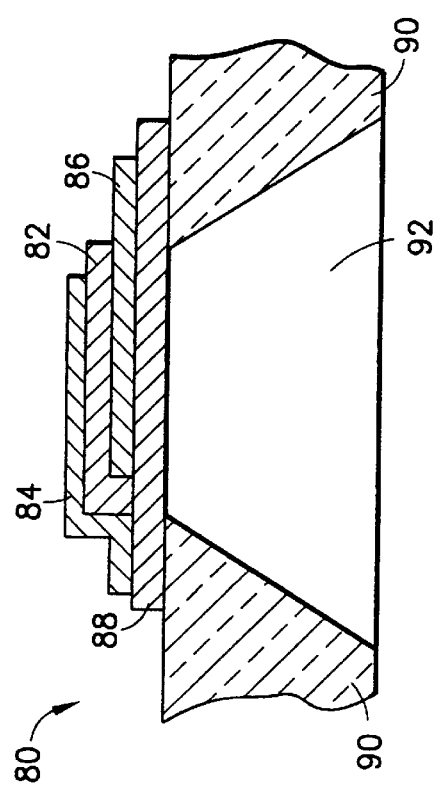
FIG. 3 illustrates a cross-section of an exemplary BAW resonator that includes a substrate having a via.

In FIG. 3, a cross-section of another type of BAW resonator 80 is shown. The resonator 80 comprises a piezoelectric layer 82, a top electrode 84, a bottom electrode 86, a membrane 88, and a substrate 90 having a via 92. The resonator 80 functions in a similar manner as the resonator 20 described above in that both of these devices employ air interfaces to reflect acoustic vibrations produced by the piezoelectric layers 22 and 82 of the respective devices. A primary difference between these resonators 20 and 80, however, is the method employed for fabricating the respective air interfaces. For example, for the resonator 80, after all of the layers 84, 86, 82, and 88 are formed, a portion of the substrate is then etched away from underneath the substrate 90 to form the via 92.

Figure 4:
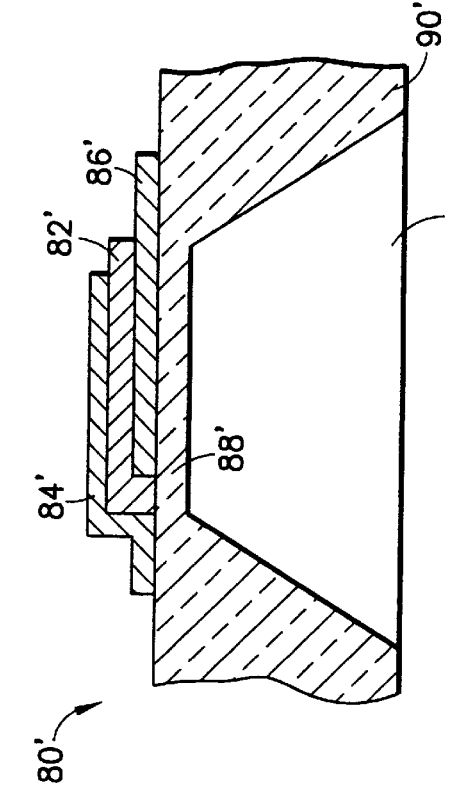
FIG. 4 illustrates a cross-section of an exemplary BAW resonator that comprises a via and a membrane formed by a portion of a substrate.

FIG. 4 illustrates another type of resonator 80' which comprises a top electrode 84', a piezoelectric layer 82', a bottom electrode 86', and a substrate 90' that includes a via 92' and a membrane 88'. The membrane 88' is formed by removing some material from underneath the substrate 90'. The resonator 80' functions like the resonator 80 of FIG. 3.

As may be appreciated, at least some of the layers that form the resonators described above may be exposed to the air.

The inventor has developed a novel and inexpensive technique for protecting layer surfaces of BAW filters. The technique avoids the high costs of using presently-available techniques for protecting exposed resonator layer surfaces from becoming contaminated or otherwise damaged. The technique also permits BAW filters to be fabricated in a manner so as to provide interfaces for reflecting acoustic waves that replace the air interfaces of known types of BAW resonators.

Figure 7A:
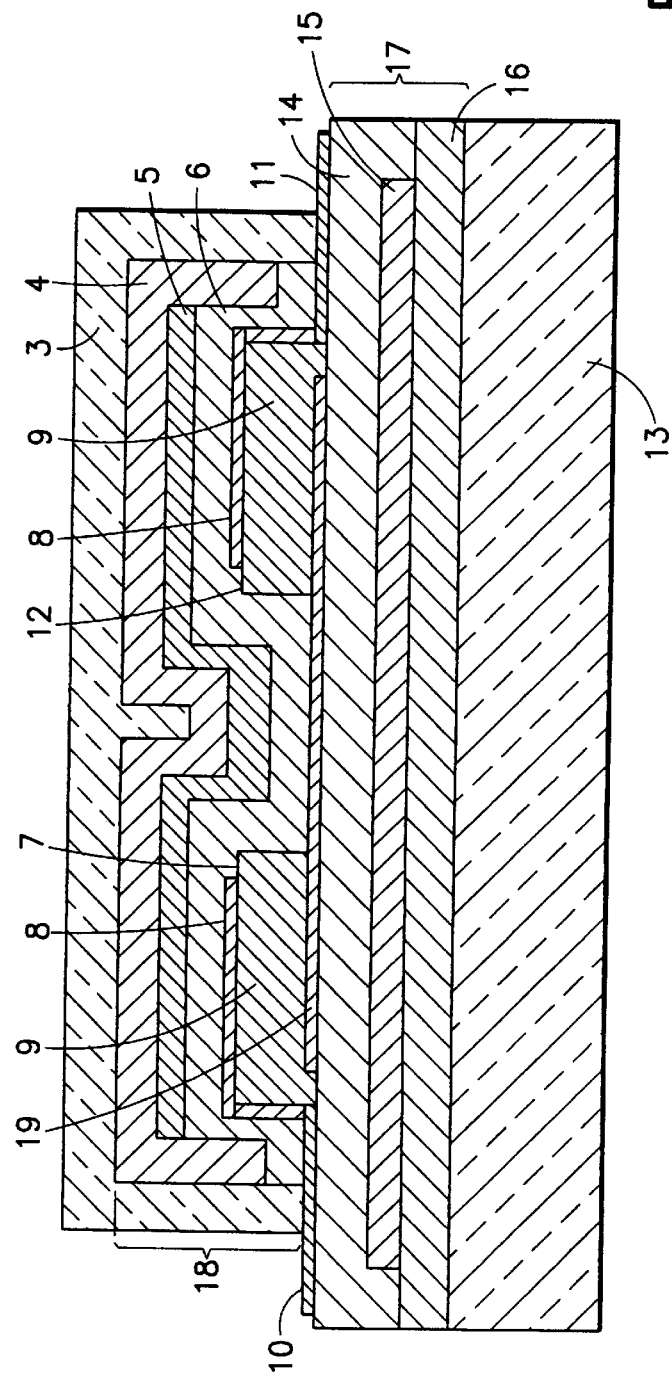
FIGS. 7a and 7b illustrate a side view of a cross-section and a top view of a cross-section, respectively, of a BAW filter that is constructed in accordance with the invention, wherein the cross-sectional view of FIG. 7a is taken along line 7a—7a of FIG. 7b, and wherein in FIG. 7b the upper acoustic mirror and protective layer are removed.
Figure 7B:
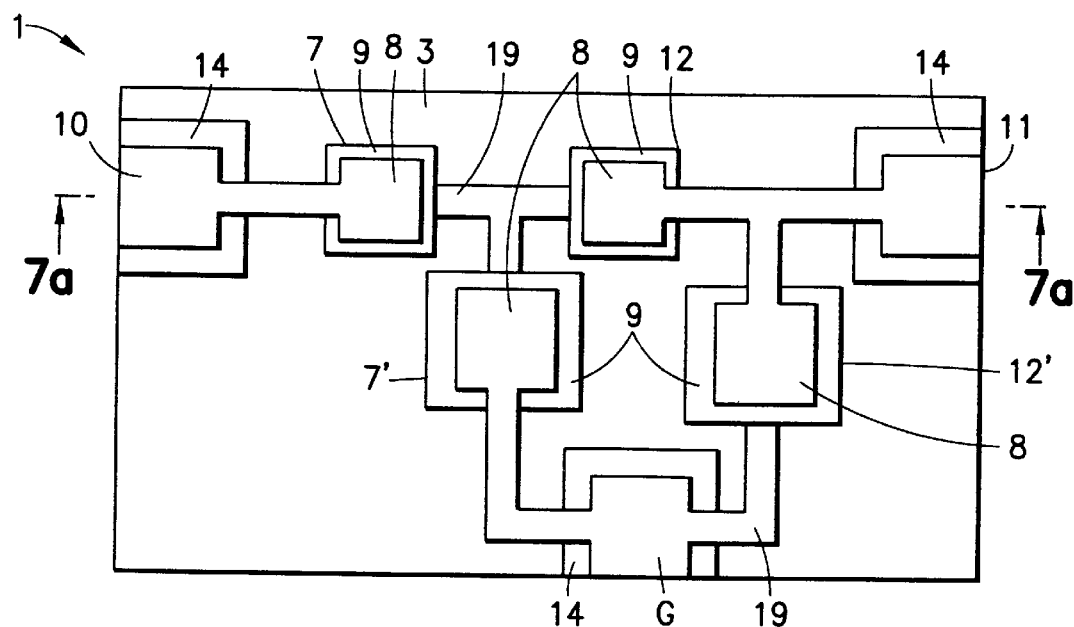

One embodiment of the invention may be understood in view of FIG. 7b, which illustrates a top view of a Bulk Acoustic Wave (BAW) filter 1 that is constructed in accordance with the invention, and in view of FIG. 7a, which represents a side view of a cross-section of the filter 1 taken along line 7a—7a of FIG. 7b. Referring first to FIG. 7a, the BAW filter 1 comprises a substrate 13, a first acoustic mirror 17 that is situated atop the substrate 13, a first resonator 7, and a second resonator 12. The first and second resonators 7 and 12 are situated over the first acoustic mirror 17. A second acoustic mirror 18 is disposed over the first and second resonators 7 and 12. Also, as can be appreciated, the second acoustic mirror 18 can be disposed over a portion of the first acoustic mirror 17, although this is not shown in FIGS. 7a or 7b. A protective passivation layer 3 is disposed over the second acoustic mirror 18.

The first, lower acoustic mirror 17 comprises three layers, namely a top layer 14, a middle layer 15, and a bottom layer 16. Each layer 14, 15, and 16 has a thickness that is, by example, approximately equal to one quarter wavelength at the resonant frequency of the BAW filter 1. The top layer 14 and bottom layer 16 are comprised of materials having low acoustic impedances such as, by example, silicon (Si), poly-silicon, aluminum (Al), or a polymer. Also, the middle layer 15 is comprised of a material having a high acoustic impedance such as, by example, gold (Au), molybdenum (Mo), or tungsten (W). As such, the acoustic impedance of the middle layer 15 is greater than the acoustic impedance of the top layer 14. Similarly, the acoustic impedance of the middle layer 15 is greater than the acoustic impedance of the bottom layer 16. Preferably, a ratio of the acoustic impedance of layer 15 to that of layer 14, and a ratio of the acoustic impedance of the layer 15 to that of layer 16, are large enough to permit the impedance of the substrate 13 to be transformed to a lower value. For cases in which the materials used to form these layers 14, 15 and 16 cause these ratios to be smaller than is necessary to transform the impedance of the substrate 13 to a desired lower value, however, additional layers may be provided within the first acoustic mirror 17 to transform this impedance to the lower value. Preferably, there are an odd number of layers included within the first acoustic mirror 17, although in practice, one or more adhesive layers may be employed if needed to securely adhere the bottom electrode 19 to the top layer 14, and/or to securely adhere the bottom layer 16 to the substrate 13. As described above, the adhesive layers may include any suitable adhesive material, depending on various factors such as, for example, the thicknesses of the layers surrounding the adhesive layers, the types of materials included within the surrounding layers, the type of deposition process used to fabricate the surrounding layers, and the environmental conditions (e.g., temperature) present during the deposition of the piezoelectric layer 9. Preferably, however, the resonator layers become securely adhered to one another after being deposited such that no adhesive layers need to be employed.

When at least one of the resonators 7 and 12 is caused to vibrate, the vibrations it produces are substantially isolated from the substrate 13 by the first acoustic mirror 17. Being that the vibrations are isolated in this manner, and because no etching of the substrate 13 is required during the fabrication of the BAW filter 1, the substrate 13 may be comprised of various low impedance materials such as, by example, Si, $SiO_2$, GaAs, glass, or a ceramic material. However, owing to the impedance transformation that occurs via the layers 14, 15 and 16 of the first acoustic mirror 17, the substrate 13 may also be comprised of high impedance materials.

In this embodiment of the invention, the second, upper or top acoustic mirror 18 also comprises three layers, namely a top layer 4, a middle layer 5, and a bottom layer 6. Each of these layers has a thickness that is, by example, approximately equal to one-quarter wavelength. The top layer 4 and the bottom layer 6 are preferably comprised of materials having low acoustic impedances, such as, by example, silicon (Si), poly-silicon, aluminum (Al), or a polymer. The middle layer 5 is preferably comprised of a material having a high acoustic impedance such as, by example, gold (Au), molybdenum (Mo), or tungsten (W). The protective passivation layer 3, which protects a top portion of the BAW filter 1, has a thickness of 0.2 $\mu$m or greater. The protective passivation layer 3 may be comprised of any suitable protective material such as, by example, epoxy, $SiO_2$, or a glop top material (e.g., an epoxy-based viscous fluid which hardens after being heated). It should be recognized that the use of three layers in the second acoustic mirror 18 is exemplary, and that a greater odd number of layers could be used, as was previously described. Also, one or more adhesive layers may be employed if needed to securely adhere the bottom layer 6 to top surfaces of resonators 7 and 12, and/or to securely adhere the top layer 4 to the protective passivation layer 3.

The first and second resonators 7 and 12 are BAW resonators. Each of these resonators 7 and 12 includes (1) a respective portion of a bottom electrode 19 that is situated over the first acoustic mirror 17, (2) a piezoelectric layer 9 that is situated over the respective portion of the bottom electrode 19 and over a respective portion of the first acoustic mirror 17, and (3) a top electrode 8 that is formed over portions of the piezoelectric layer 9 and over a respective portion of the first acoustic mirror 17. A portion of the top electrode 8 of the first resonator 7 is not covered by the second acoustic mirror 18 or the protective passivation layer 3, and is exposed for providing a first contact pad 10. Similarly, a portion of the top electrode 8 of the second resonator 12 is not covered by the second acoustic mirror 18 or the protective passivation layer 3, and is exposed for providing a second contact pad 11. Also, referring to FIG. 7b, another portion of this top electrode 8 of resonator 12 forms a top electrode of a resonator 12', which will be described below.

Figure 11:
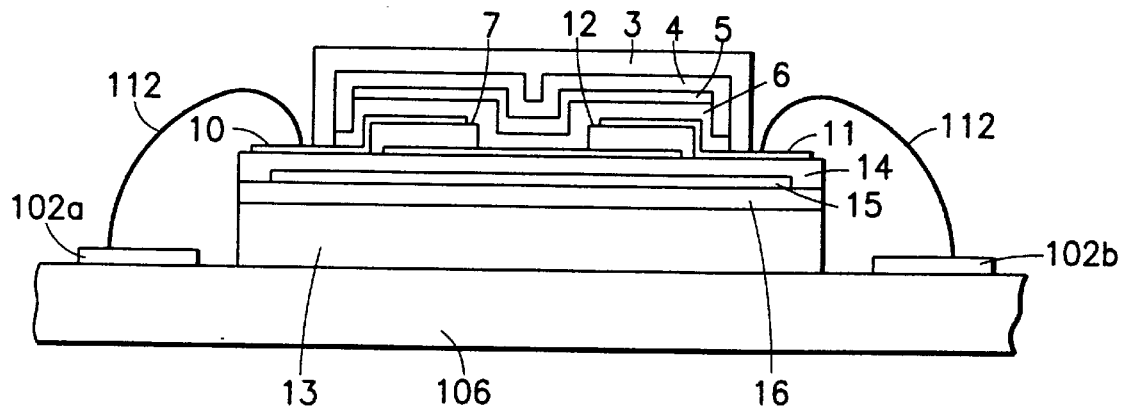
FIG. 11 shows the BAW filter of FIG. 7a coupled to contacts of a circuit board by bonding wires.
Figure 12:
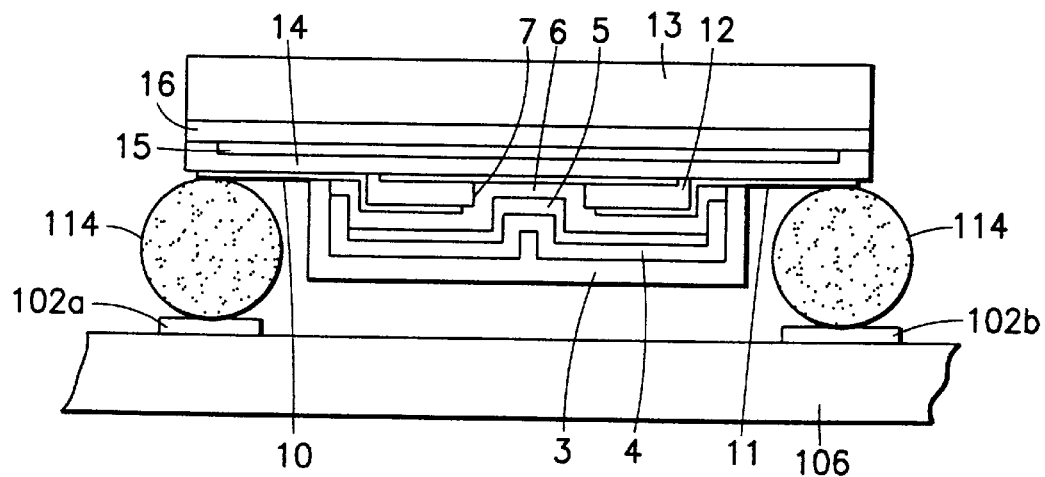
FIG. 12 shows the BAW filter of FIG. 7a, after having been coupled to contacts of a circuit board using flip-chip technology.

The contact pads 10 and 11 of the BAW filter 1 provide an input and an output respectively for the filter 1. The contact pads 10 and 11 permit the BAW filter 1 to be electrically coupled to an external circuit by wire or solder bonding, or by another suitable technique. By example, and referring to FIG. 11, contact pads 10 and 11 can be coupled to respective contact pads 102a and 102b of a circuit board 106 via bonding wires 112. Also by example, and referring to FIG. 12, contact pads 10 and 11 can be coupled to contact pads 102a and 102b of circuit board 106 via solder bumps 114, using flip-chip technology.

Figure 7C:
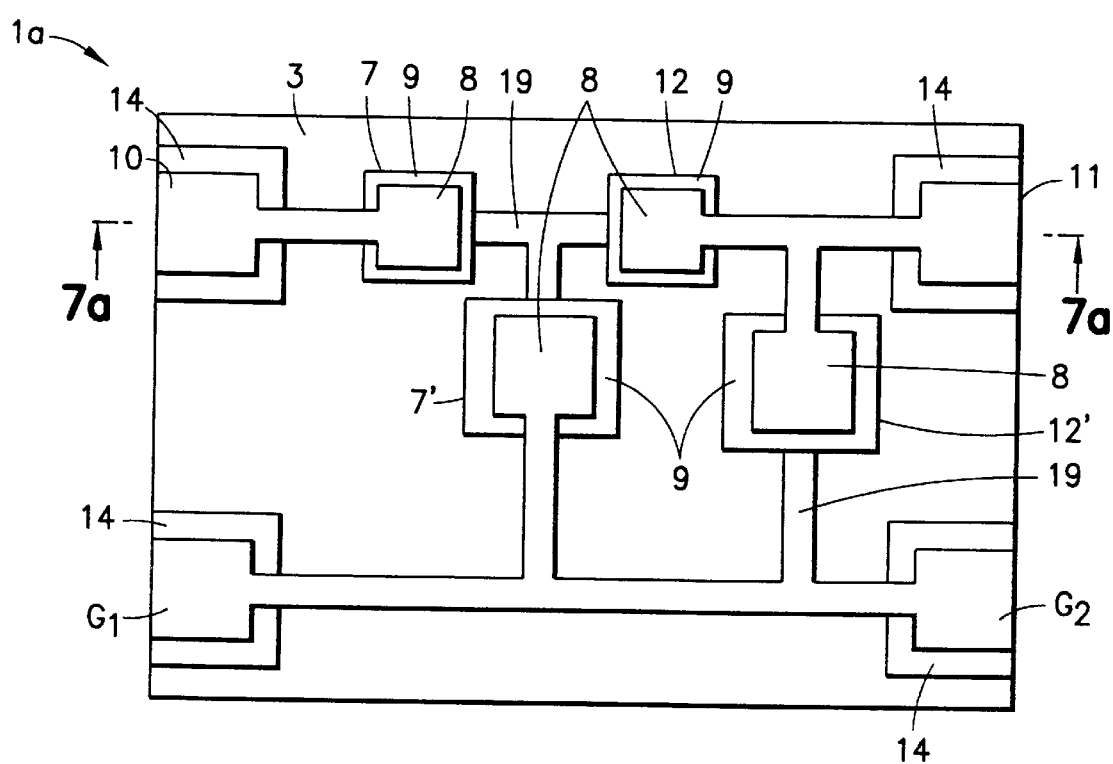
FIG. 7c illustrates a top view of a cross-section of a BAW filter that is constructed in accordance with another embodiment of the invention, wherein in FIG. 7c the upper acoustic mirror and protective layer are removed, wherein a side view of another cross-section of the BAW filter is represented by FIG. 7a, and wherein the cross-sectional view of FIG. 7a is taken along line 7a—7a of FIG. 7c.
Figure 7D:
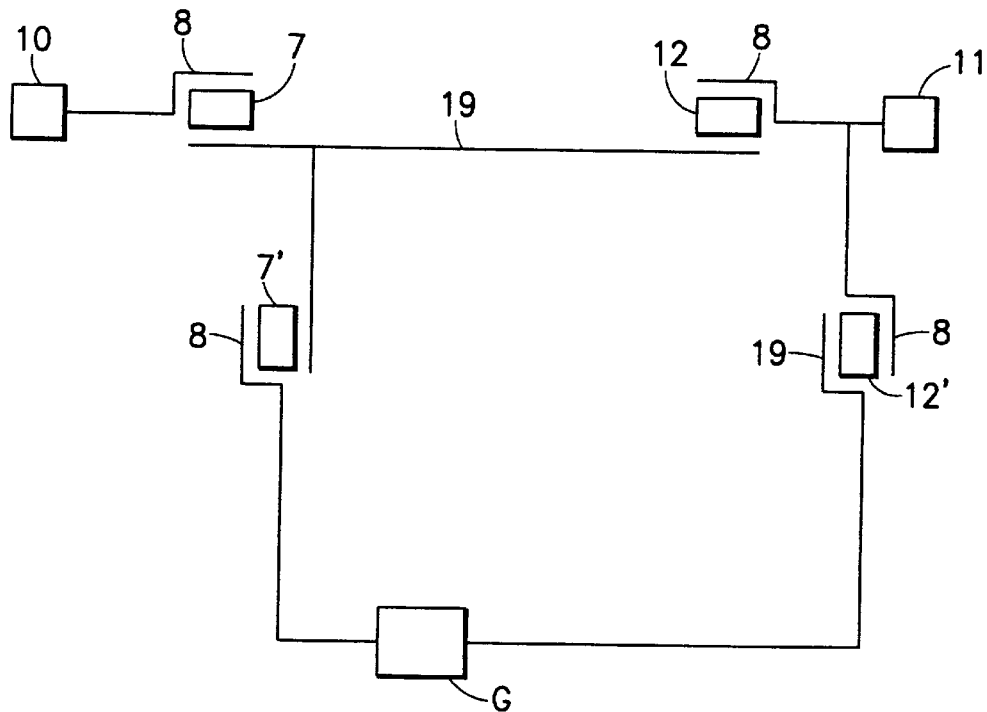
FIG. 7d illustrates a schematic diagram of the BAW filter of FIGS. 7a and 7b.

Referring to FIG. 7b, the filter 1 also includes third and fourth resonators 7' and 12', respectively, in addition to the first and second resonators 7 and 12. The third and fourth resonators 7' and 12' are constructed of similar components as the resonators 7 and 12. Also shown in FIG. 7b is a ground contact pad (G). The ground contact pad (G) is connected to top electrode 8 of the third resonator 7', and is not covered by the second acoustic mirror 18 or the protective passivation layer 3. The ground contact pad (G) is also coupled to a portion of bottom electrode 19 of the fourth resonator 12'. As can be appreciated in view of FIG. 7b, the filter 1 has a ladder topology. A schematic diagram of the filter 1 is shown in FIG. 7d.

Figure 7E:
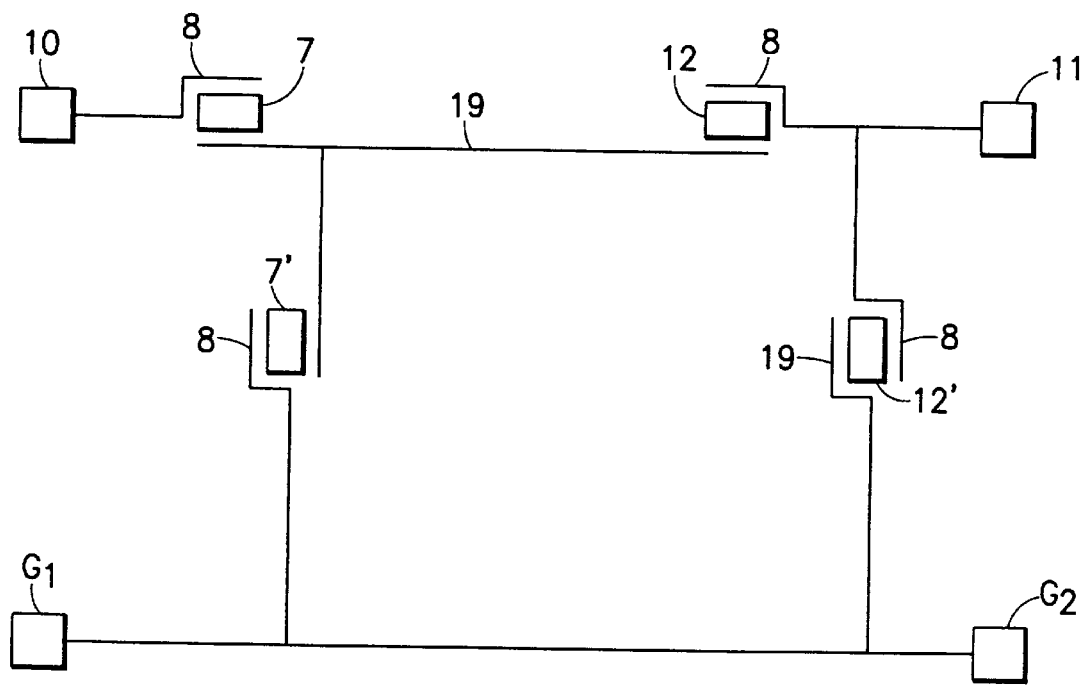
FIG. 7e illustrates a schematic diagram of the BAW filter of FIGS. 7a and 7c.

As can be appreciated, the filter 1 may have other configurations. By example, FIG. 7c shows a top view of a cross-section of a filter 1a that is constructed in accordance with another embodiment of the invention. In this embodiment of the invention, the filter 1a is constructed of similar components as the filter 1 shown in FIG. 7b, except that two ground contact pads (G1) and (G2) are provided instead of only a single ground contact pad (G). The ground contact pads (G1) and (G2) are not covered by the second acoustic mirror 18 or the protective passivation layer 3. Both of the ground contact pads (G1) and (G2) are coupled to the top electrode 8 of the resonator 7' and to the bottom electrode 19 of the resonator 12'. A schematic diagram of the filter 1a is shown in FIG. 7e.

Figure 8A:
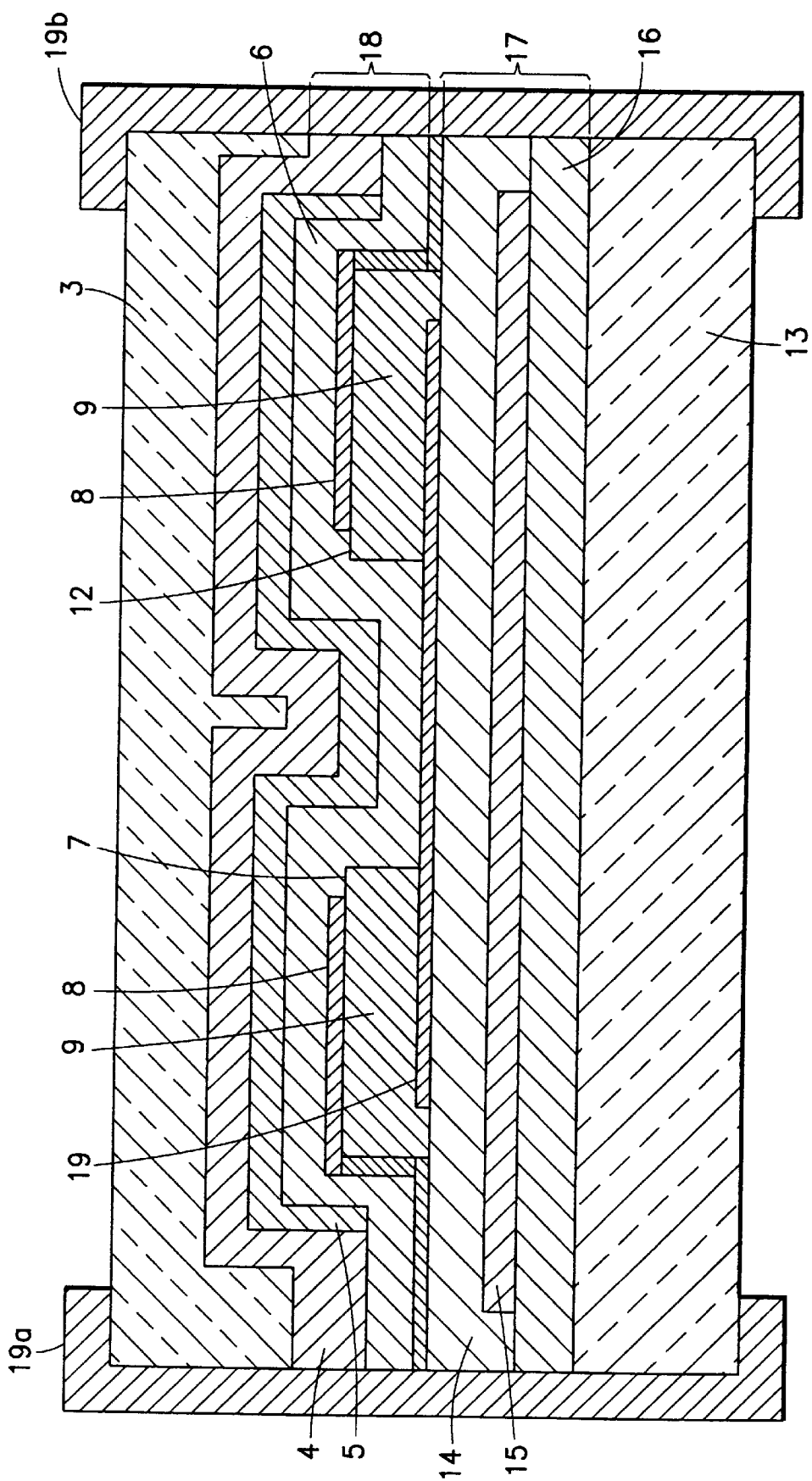
FIGS. 8a and 8b illustrate a side view of a cross-section and a top view of a cross-section, respectively, of a BAW filter that is constructed in accordance with another embodiment of the invention, wherein the cross-sectional view of FIG. 8a is taken along line 8a—8a of FIG. 8b, and wherein in FIG. 8b the upper acoustic mirror and protective layer are removed.
Figure 8B:
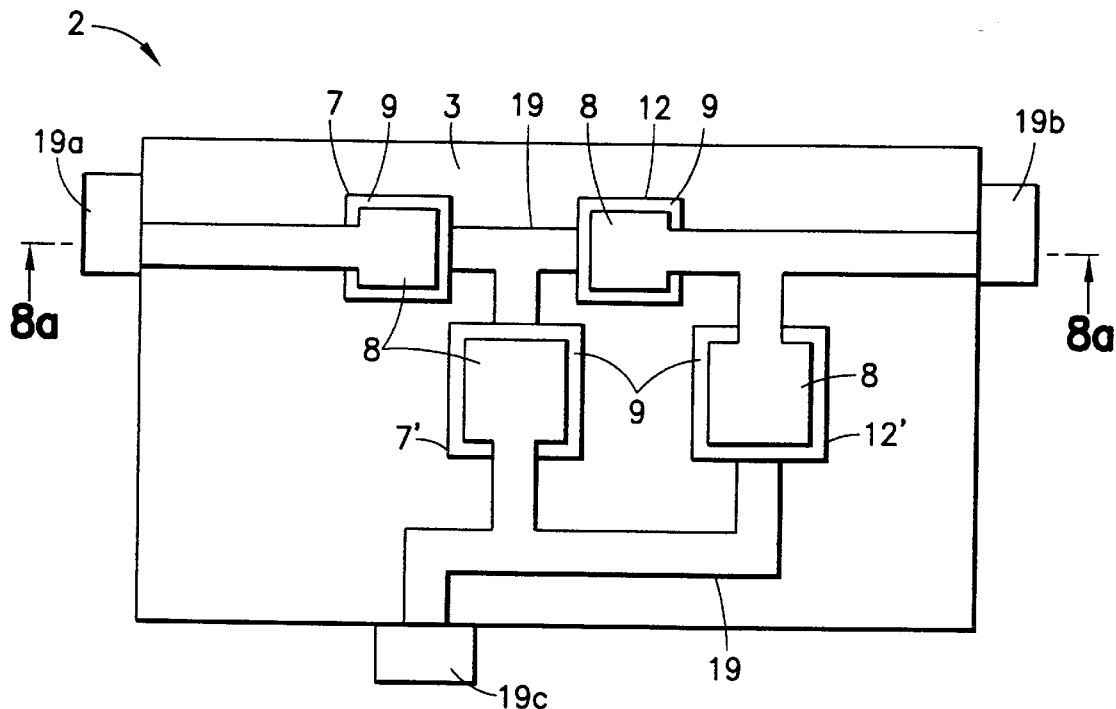

FIGS. 8a and 8b illustrate a side view of a cross-section and a top view of a cross-section, respectively, of a BAW filter 2 that is constructed in accordance with another embodiment of the invention. The BAW filter 2 of FIGS. 8a and 8b is formed of similar layers as the BAW filter 1 of FIGS. 7a and 7b. However, in this embodiment of the invention, the portions of the electrodes which formed the contact pads 10, 11, and (G) of FIGS. 7a and 7b are fully covered by the second acoustic mirror 18 (although this is not shown for resonators 7' and 12'). As such, no exposed contact pads 10, 11 and (G) are provided. The BAW filter 2 does, however, include contacts 19a, 19b, and 19c (i.e., electrodes) that are disposed over external surfaces of the BAW filter 2.

Figure 8C:
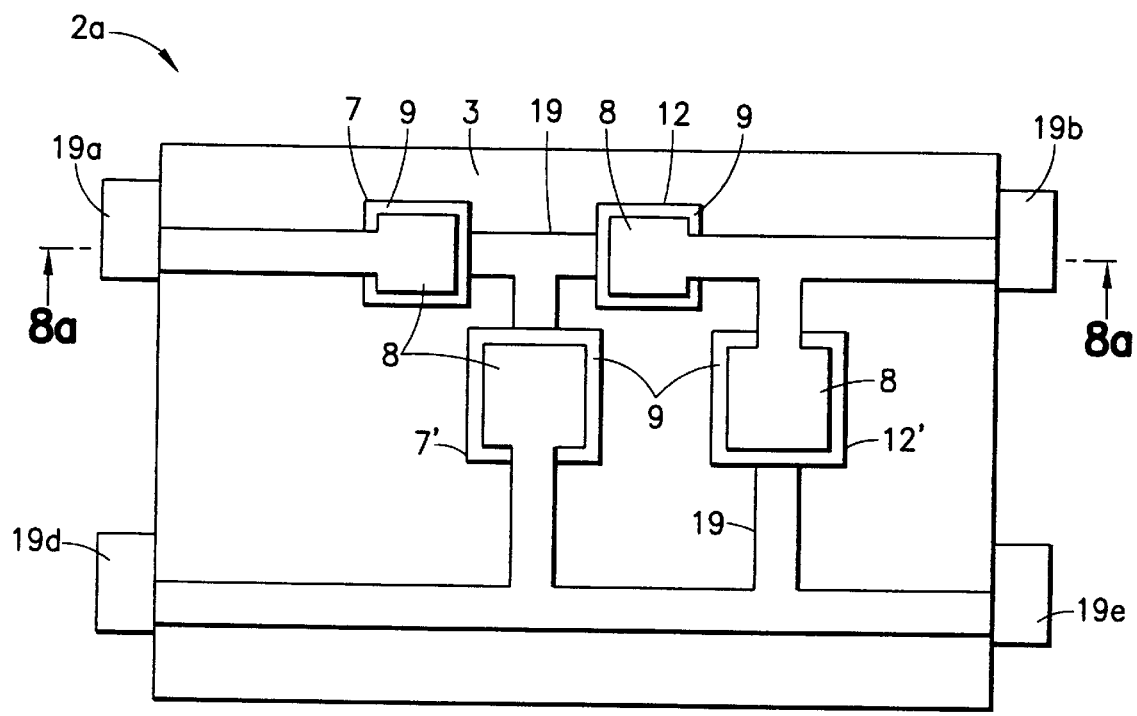
FIG. 8c illustrates a top view of a cross-section of a BAW filter that is constructed in accordance with another embodiment of the invention, wherein in FIG. 8c the upper acoustic mirror and protective layer are removed, wherein a side view of a cross-section of the BAW filter is represented by FIG. 8a, and wherein the cross-sectional view of FIG. 8a is taken along line 8a—8a of FIG. 8c.
Figure 8D:
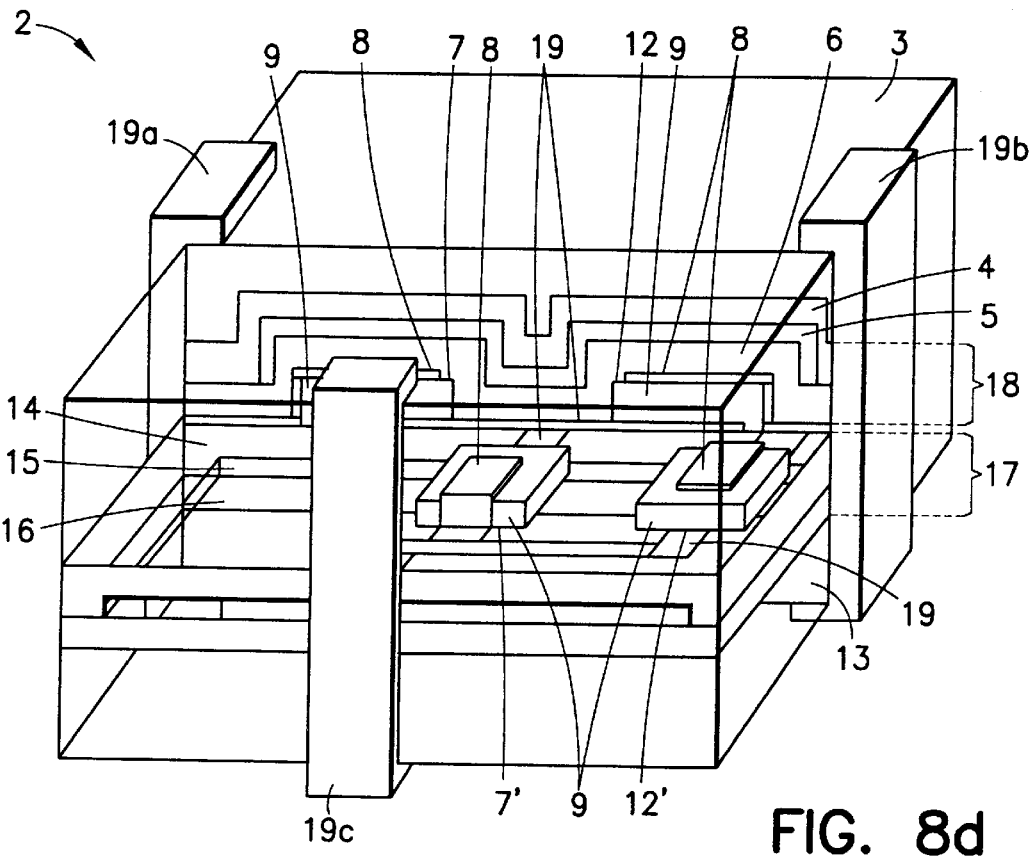
FIG. 8d shows a perspective view of the BAW filter of FIGS. 8a and 8b.

FIG. 8d shows a perspective view of the BAW filter 2, with the top acoustic mirror 18 and the protective layer 3 removed from the area of the filter 2 including the resonators 7' and 12' (only the piezoelectric layers 9 and the top and bottom electrodes 8 and 19, respectively, of the resonators 7' and 12' are shown in FIG. 8d). Contacts 19a and 19b are disposed over opposite external surfaces of the BAW filter 2, and contact 19c is disposed over another external surface of the BAW filter 2. Contacts 19a and 19b are situated adjacent to respective portions of the protective passivation layer 3, the first and second acoustic mirrors 17 and 18, the substrate 13, and to a portion of the electrode 8 of a respective one of the resonators 7 and 12. Contact 19a is electrically coupled to the top electrode 8 of the first resonator 7, and contact 19b is electrically coupled to the top electrode 8 of the second resonator 12.

Contact 19c is situated adjacent to respective portions of the protective passivation layer 3, the first and second acoustic mirrors 17 and 18, and the substrate 13, and is electrically coupled to the top electrode 8 of the third resonator 7' and to the bottom electrode 19 of the fourth resonator 12'. Each contact 19a, 19b, and 19c is comprised of an electrically conductive material such as, by example, gold (Au). The contacts 19a, 19b, and 19c enable the BAW filter 2 to be electrically coupled to an external circuit.

Figure 10A:
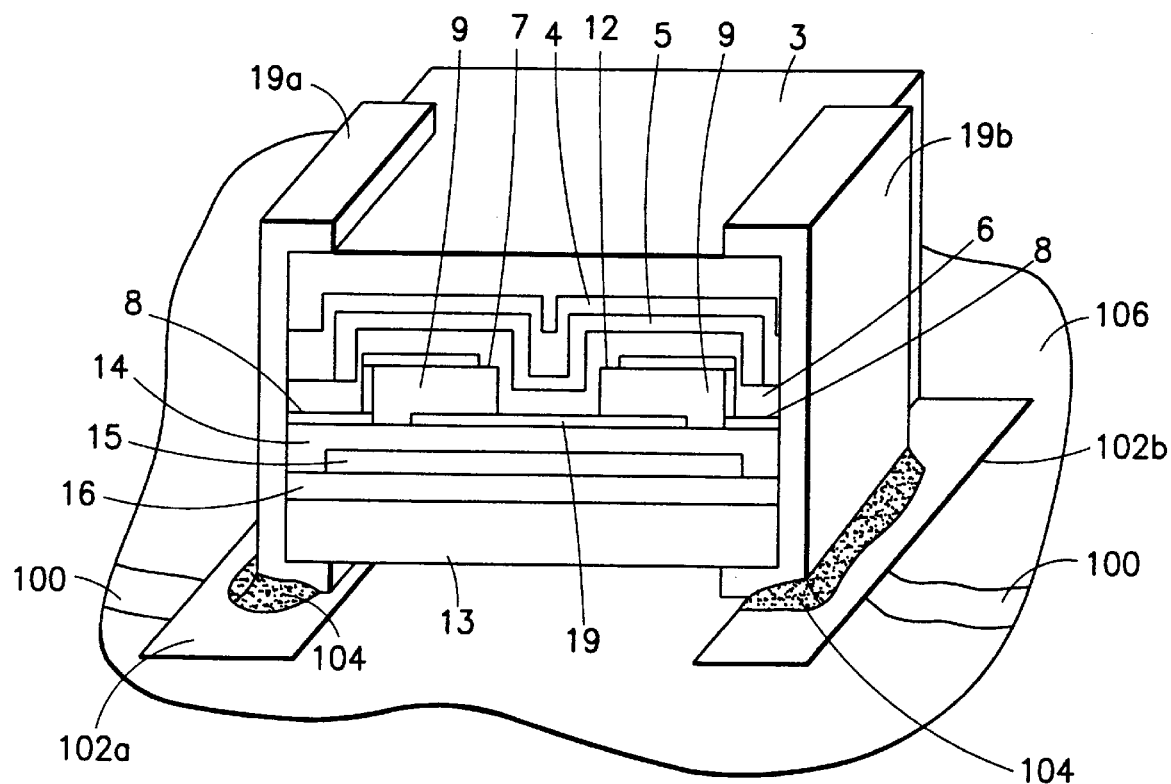
FIG. 10a illustrates a cross section of a BAW filter of the invention surface mounted on a circuit board.
Figure 10B:
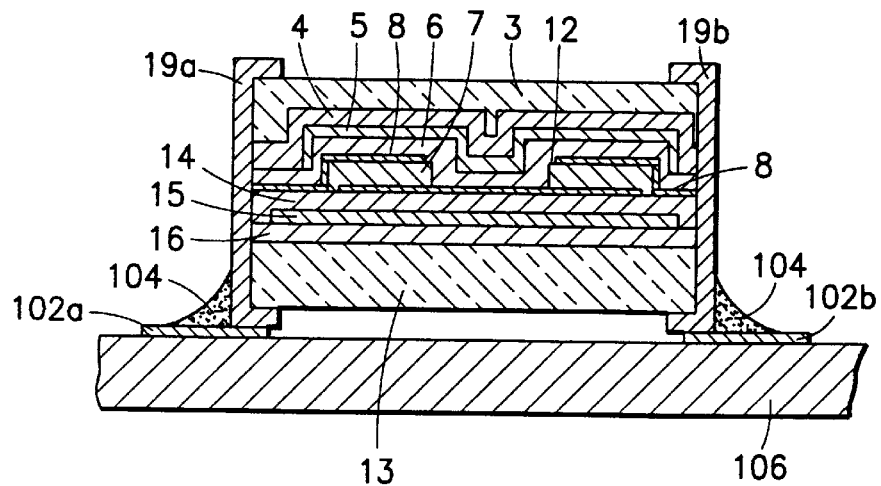
FIG. 10b illustrates a front view the cross section of the BAW filter of FIG. 10a surface mounted on a circuit board.

It can be appreciated that the placement of the contacts 19a, 19b, and 19c enable the BAW filter 2 to be attached to a circuit board by surface mounting techniques, thereby simplifying circuit assembly. By example, and referring to FIGS. 8f, 10a, and 10b (FIGS. 10a and 10b represent a cross section of the BAW filter 2), the BAW filter 2 can be surface mounted on a circuit board 106 by soldering the contacts 19a, 19b, and 19c to respective contact pads 102a, 102b, and 102c of the circuit board 106. This enables the contacts 19a, 19b, and 19c to be electrically coupled to circuit board wiring 100. It can also be appreciated that the contacts 19a, 19b, and 19c further serve to at least partially isolate the BAW filter 2 from environmental contaminants such as, by example, solder 104 or solvents, that may be encountered during assembly and subsequent use.

As can be appreciated, the BAW filter 2 may have other configurations. By example, FIG. 8c shows a top view of a cross-section of a BAW filter 2a that is constructed in accordance with another embodiment of the invention. A side view of a cross-section of the BAW filter 2a taken along line 8a—8a of FIG. 8c is represented by FIG. 8a. The BAW filter 2a is formed of similar layers as the BAW filter 1a of FIGS. 7a and 7c. However, in this embodiment of the invention, the portions of the electrodes which formed the contact pads 10, 11, (G1), and (G2) of FIGS. 7a and 7c are fully covered by the second acoustic mirror 18 (although this is not shown for resonators 7' and 12'), and no exposed contact pads 10, 11, (G1), and (G2) are provided.

Figure 8E:
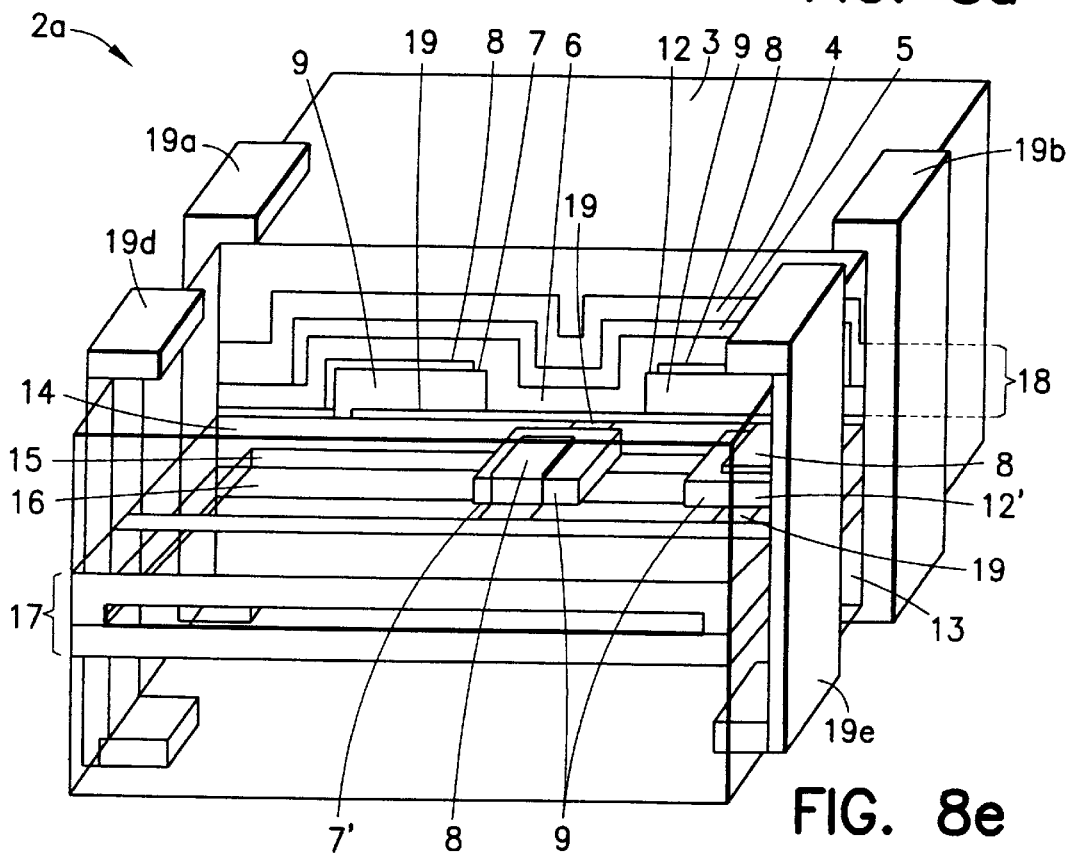
FIG. 8e shows a perspective view of the BAW filter of FIGS. 8a and 8c.
Figure 8F:
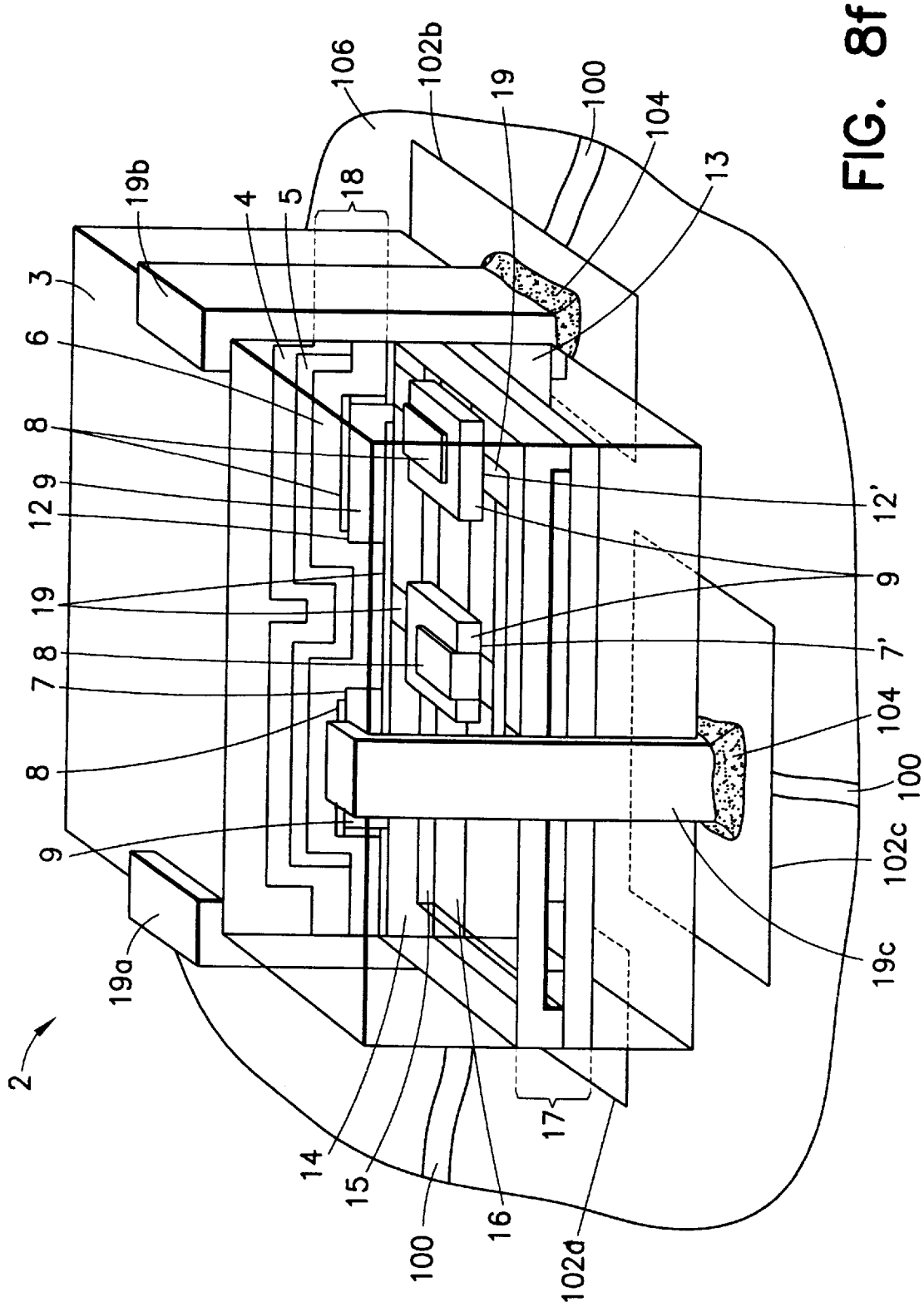
FIG. 8f illustrates the BAW filter of FIG. 8d surface mounted on a circuit board.

FIG. 8e shows a perspective view of the BAW filter 2a, with the top acoustic mirror 18 and the protective layer 3 removed from the area of the filter 2a including the resonators 7' and 12'. The BAW filter 2a includes contacts 19a and 19b, which are similar to those described above, and also includes contacts 19d and 19e. Contacts 19a and 19b are disposed over opposite external surfaces of the filter 2a, and contacts 19d and 19e are also disposed over opposite external surfaces of the filter 2a. The contacts 19a, 19b, 19d, and 19e are comprised of an electrically conductive material such as, by example, gold (Au). Contact 19a is electrically coupled to the top electrode 8 of the first resonator 7, and contact 19b is electrically coupled to the top electrode 8 of the second resonator 12. Also, each of the contacts 19d and 19e is electrically coupled to the top electrode 8 of the third resonator 7' and to the bottom electrode 19 of the fourth resonator 12'. The contacts 19a, 19b, 19d, and 19e enable the BAW filter 2a to be electrically coupled to an external circuit.

Figure 8G:
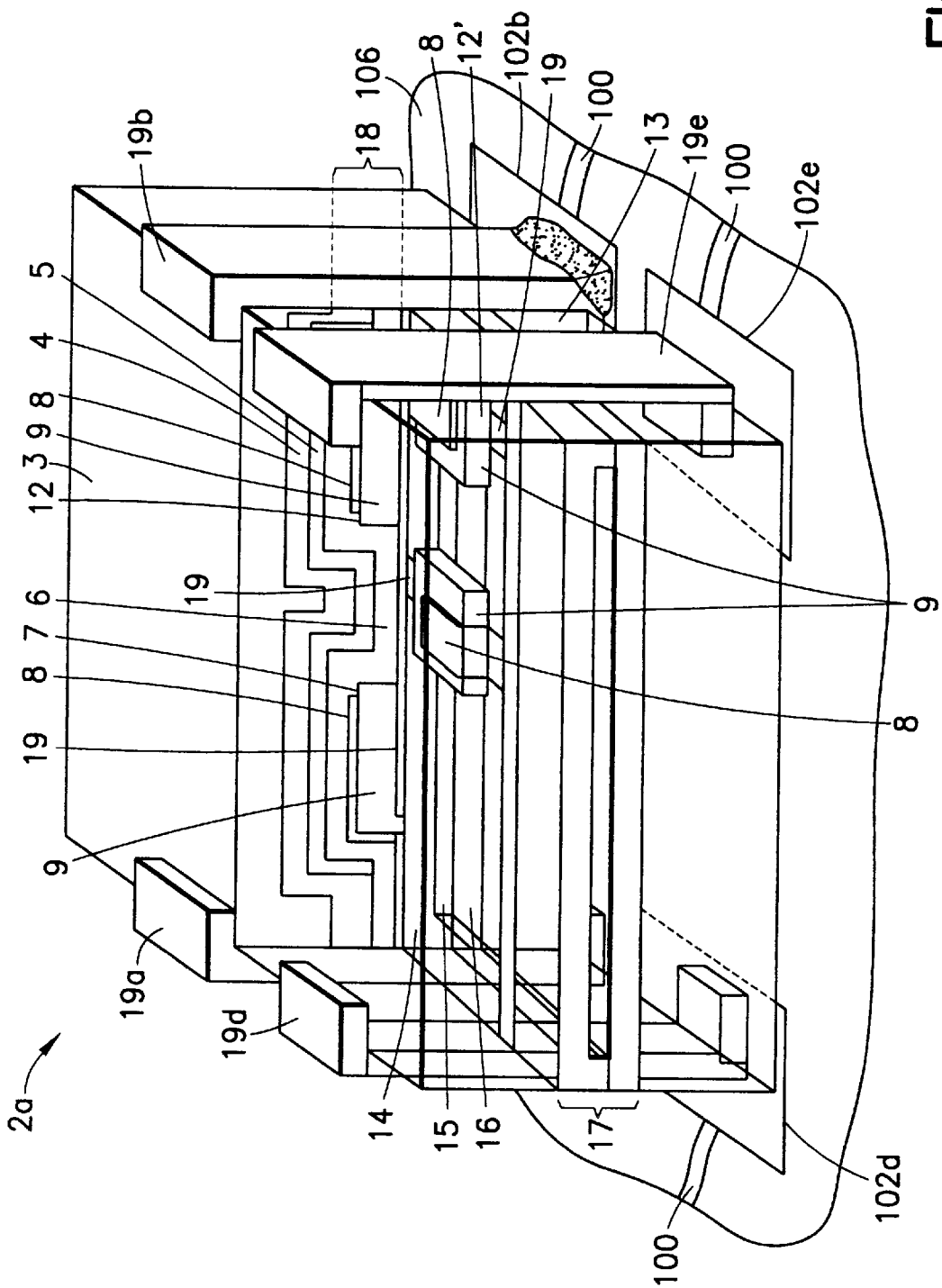
FIG. 8g illustrates the BAW filter of FIG. 8e surface mounted on a circuit board.

As can be appreciated, the placement of the contacts 19a, 19b, 19d, and 19e enable the BAW filter 2a to be attached to a circuit board by surface mounting techniques, thereby simplifying circuit assembly. By example, and referring to FIGS. 8g, 10a, and 10b (FIGS. 10a and 10b represent a cross section of the BAW filter 2a), the BAW filter 2a can be surface mounted on a circuit board 106 by soldering the contacts 19a, 19b, 19d, and 19e to respective contact pads 102a, 102b, 102d, and 102e of the circuit board 106. This enables the contacts 19a, 19b, 19d, and 19e to be electrically coupled to circuit board wiring 100. It can also be appreciated that the contacts 19a, 19b, 19d and 19e further serve to at least partially isolate the BAW filter 2a from environmental contaminants such as, by example, solder 104 or solvents, that may be encountered during assembly and subsequent use.

Figure 13A:
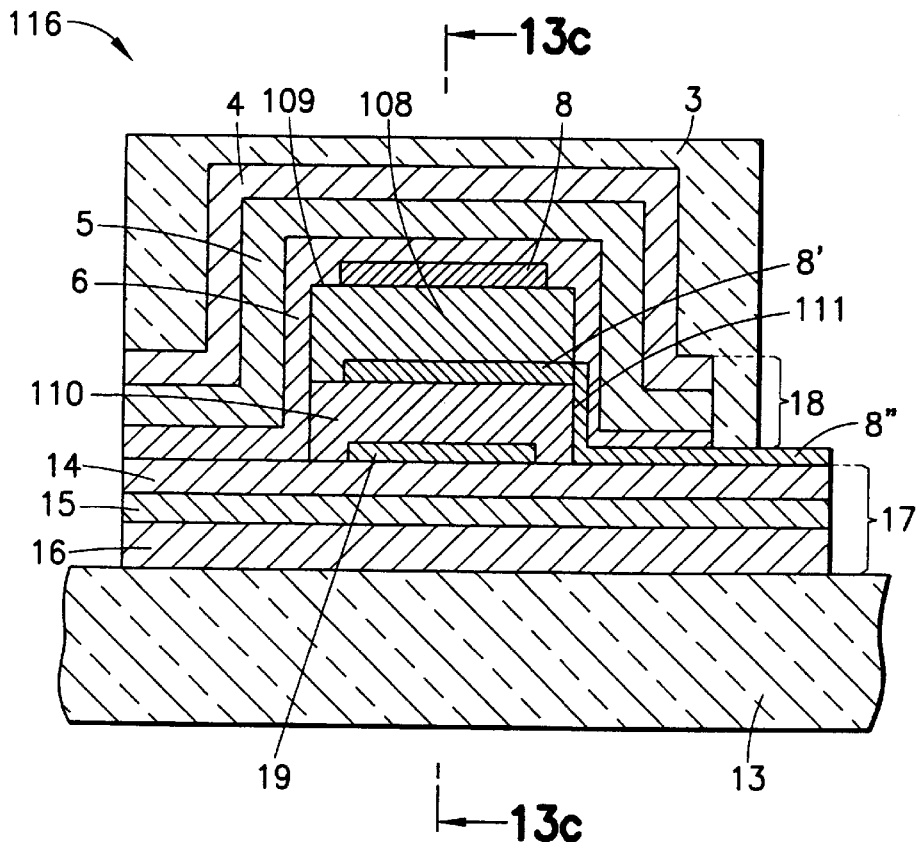
FIG. 13a is a cross-section of a Stacked Crystal Filter (SCF) that is constructed in accordance with an embodiment of the invention, wherein a top portion of the SCF includes an acoustic mirror.
Figure 13B:
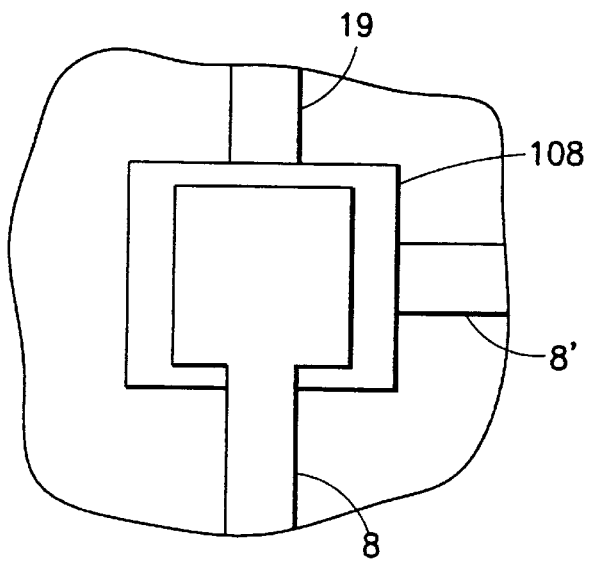
FIG. 13b shows a top view of a portion of the SCF of FIG. 13a, with the acoustic mirror removed.
Figure 13C:
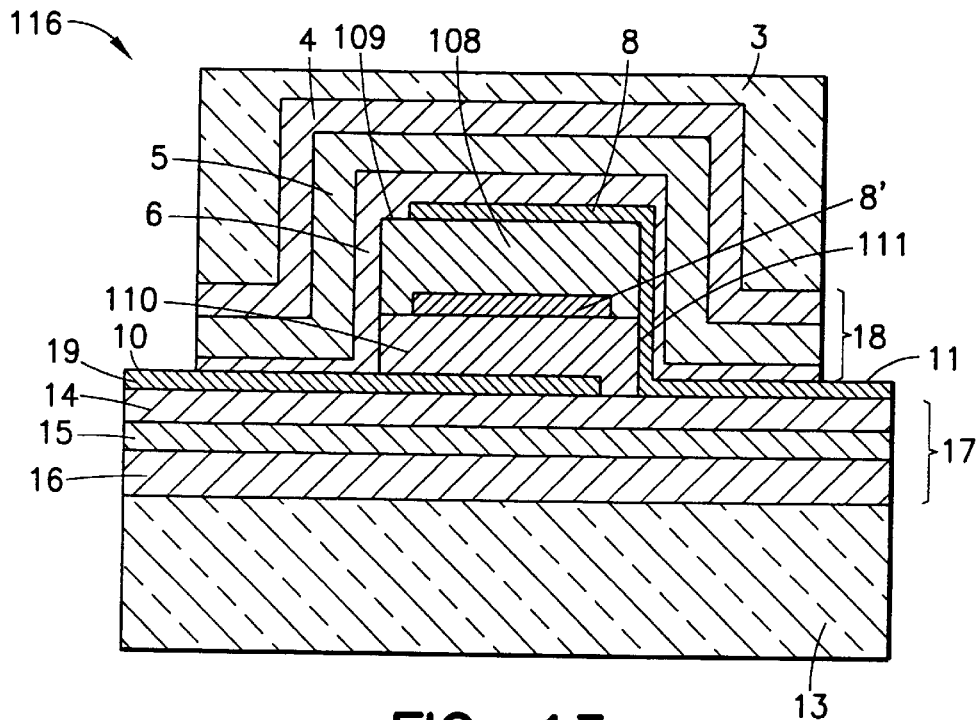

FIGS. 13a–13c illustrate various views of another embodiment of the invention, namely a BAW filter 116 having a stacked filter structure. The filter 116 is also referred to as a "Stacked Crystal Filter" (SCF) 116. SCFs are two part devices and exhibit only a series resonance. The SCF 116 includes a substrate 13, a first, bottom acoustic mirror 17, a second, top acoustic mirror 18, and a protective passivation layer 3, which are similar to those described above. The SCF 116 also comprises a first, bottom resonator 111, and a second, top resonator 109. The bottom resonator 111 is disposed over the bottom acoustic mirror 17. The top resonator 109 is disposed over the first resonator 111, thereby forming a resonator stack.

The first, bottom resonator 111 includes a piezoelectric layer 110, a lower electrode 19, and a ground electrode 8'. The piezoelectric layer 110 is located between portions of the ground electrode 8' and the electrode 19. The second, top resonator 109 includes the ground electrode 8', a piezoelectric layer 108, and an upper electrode 8. The piezoelectric layer 108 is disposed between portions of the ground electrode 8' and the upper electrode 8. The piezoelectric layers 108 and 110 and the electrodes 8, 8', and 19 comprise similar materials and may have similar thicknesses as those described above.

The second acoustic mirror 18 covers the resonator stack and portions of the first acoustic mirror 17. As can be seen in view of FIG. 13a, a portion of the ground electrode 8' is not covered by the second acoustic mirror 18 or the protective passivation layer 3, and is exposed for providing a ground contact pad 8". Similarly, as can be seen in view of FIG. 13c, portions of the upper and lower electrodes 8 and 19, respectively, are not covered by the second acoustic mirror 18 or by the protective passivation layer 3, and are exposed for providing first and second contact pads 10 and 11, respectively. The contact pads 8", 10 and 11 permit the SCF 116 to be electrically coupled to an external circuit by wire or solder bonding, or by another suitable technique. By example, and referring to FIG. 13e, contact pads 10 and 11 can be coupled to respective contact pads 102a and 102b of a circuit board 106 via bonding wires 112. Also by example, and referring to FIG. 13f, contact pads 10 and 11 can be coupled to contact pads 102a and 102b of circuit board 106 via solder bumps 114, using flip-chip technology. It should be noted that, although not shown in FIGS. 13e and 13f, the contact pad 81" of the SCF 116 can also be coupled to the circuit board 106 using these techniques.

Figure 13D:
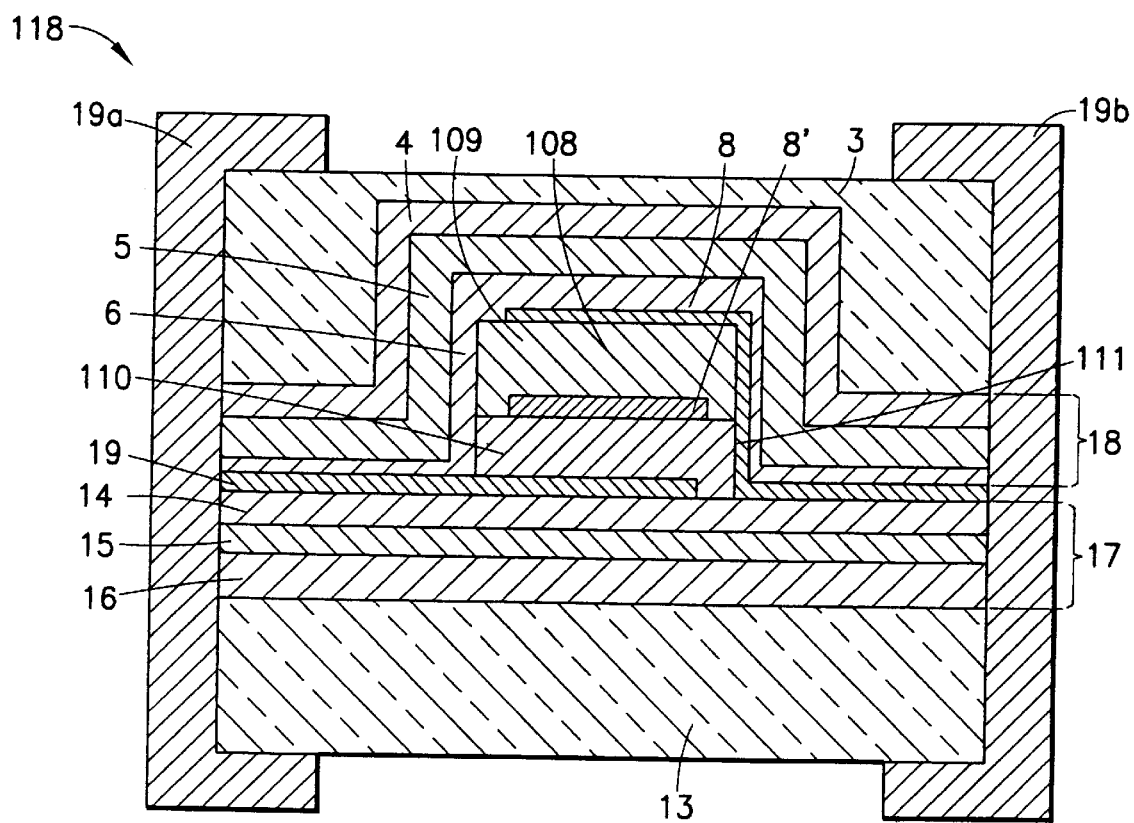
FIG. 13d shows a cross-section of a Stacked Crystal Filter that is constructed in accordance with another embodiment of the invention.
Figure 13E:
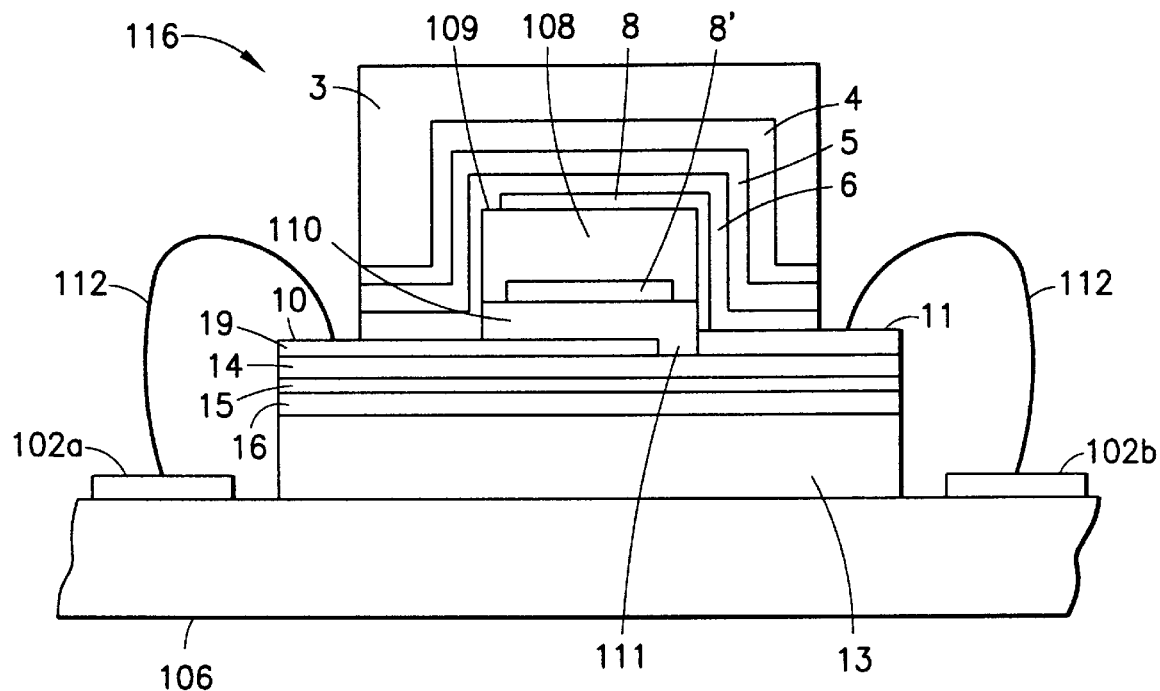
FIG. 13e shows the Stacked Crystal Filter of FIG. 13c coupled to contacts of a circuit board by bonding wires.
Figure 13F:
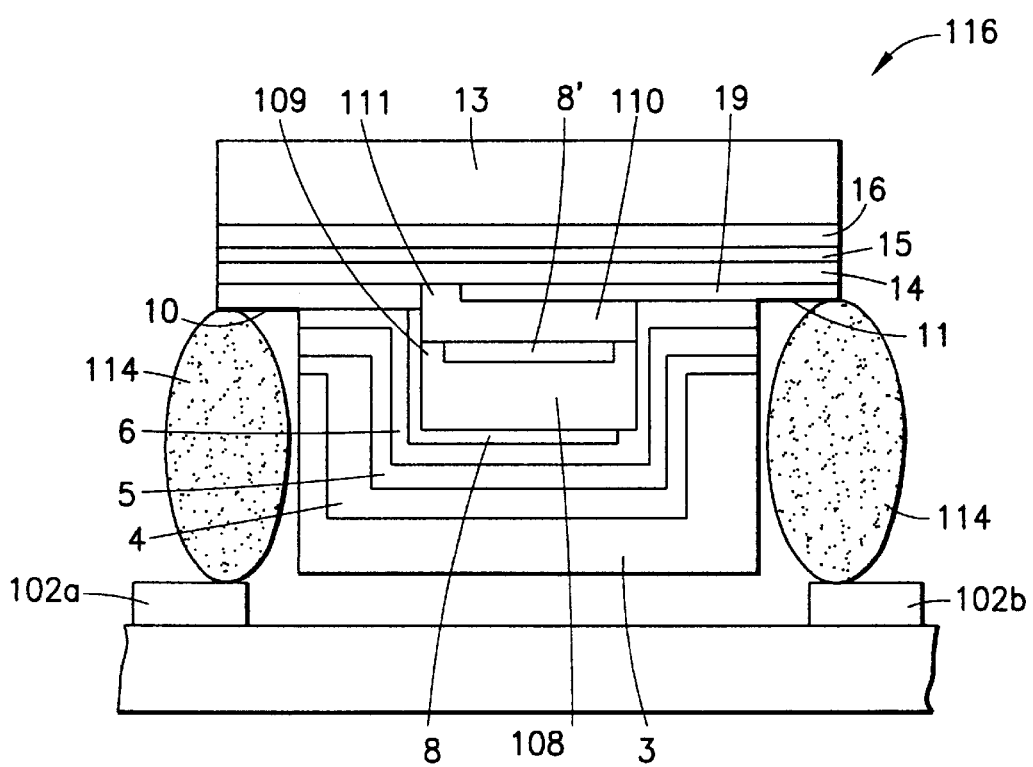
FIG. 13f shows the Stacked Crystal Filter of FIG. 13c, after having been coupled to contacts of a circuit board using flip-chip technology.
Figure 13G:
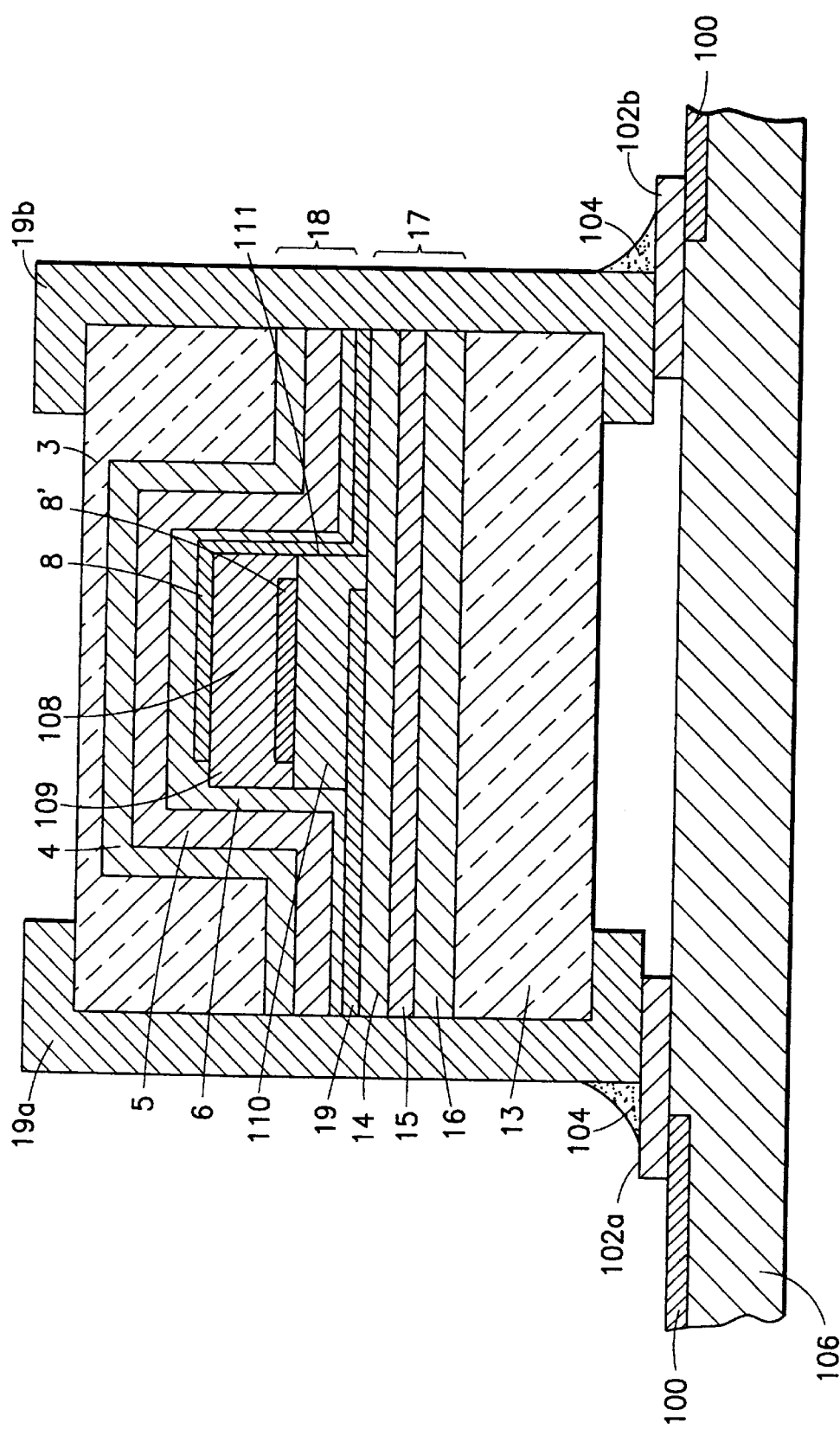
FIG. 13g shows the Stacked Crystal Filter of FIG. 13d surface mounted on a circuit board.

FIG. 13d illustrates a cross-section of a SCF 118 that is constructed in accordance with another embodiment of the invention. The SCF 118 has a similar structure as the SCF 116 of FIGS. 13*a*–13*c*. However, in this embodiment of the invention, the portions of the electrodes 8, 8', and 19 that formed the contact pads 10, 8", and 11 of the SCF 116 are fully covered by the second acoustic mirror 18. As such, no exposed contact pads 10, 8", and 11 are provided. The SCF 118 does, however, include contacts 19*a* and 19*b* (i.e., electrodes) that are disposed over opposite external surfaces of the SCF 118. Each contact 19*a* and 19*b* is situated adjacent to respective portions of the protective passivation layer 3, the first and second acoustic mirrors 17 and 18, the substrate 13, and to respective portions of the electrodes 8 and 19. Each contact 19*a* and 19*b* is constructed of, by example gold (Au). Contact 19*a* is electrically coupled to the lower electrode 19 and contact 19*b* is electrically coupled to upper electrode 8. The contacts 19*a* and 19*b* enable the SCF 118 to be electrically coupled to an external circuit. By example, and referring to FIG. 13*g*, the contacts 19*a* and 19*b* enable the SCF to be surface mounted to a circuit board 106. This may be accomplished by soldering the contacts 19*a* and 19*b* to respective contact pads 102*a* and 102 of the circuit board 106, thereby enabling the contacts 19*a* and 19*b* to be electrically coupled to circuit board wiring 100. As can also be appreciated, the contacts 19*a* and 19*b* further serve to at least partially isolate the SCF 118 from environmental contaminants such as, for example, solder 104 or solvents, that may be encountered during assembly and subsequent use.

Having described a number of embodiments of the invention, it should be noted that the BAW filters 1, 1*a*, 2, and 2*a*, and the SCFs 116 and 118 described above may comprise more or less than the number of piezoelectric layers and electrodes described above, depending on filter performance requirements for a particular application of interest. It should also be noted that the first and second acoustic mirrors 17 and 18 of these devices may each comprise more than three layers. By example, the first and second acoustic mirrors 17 and 18 may each comprise an additional two, four, six, or more layers, as long as the total number of layers employed are arranged such that consecutive ones of these layers have alternating high and low impedances. In addition, adhesive layers may be employed if needed for securely adhering the top and bottom acoustic mirrors 17 and 18 to respective portions of the filter structures. It should be further noted that the topologies of the BAW filters 1, 1*a*, 2, and 2*a* described above is not intended to be limiting to the scope of the invention, and that other topologies may be provided. For example, the BAW filters 1, 1*a*, 2, and 2*a* may include more or less than the number of resonators, contact pads, and/or external contacts described above.

The use of a second (i.e., top) acoustic mirror offers a number of advantages over devices that only include a single acoustic mirror, such as the one shown in FIG. 6. One advantage of employing a second acoustic mirror can be appreciated in view of the following description.

When, for example, a voltage is applied across the top and bottom electrodes 8 and 19 of any one of the resonators 7, 12, 7', and 12' of the BAW filters 1, 1*a*, 2, and 2*a*, an electric field is created between these electrodes 8 and 19 that causes the piezoelectric layer 9 to vibrate. Similarly, when a voltage is applied across the electrodes 8 and 19 of any one of the SCFs 116 and 118, an electric field is created between each of these electrodes 8 and 19 and the ground electrode 8', causing the piezoelectric layers 108 and 110 to vibrate. As a result, acoustic waves propagate from each vibrating piezoelectric layer within these filters in a direction that is towards the first, lower acoustic mirror 17 of the respective filters. Owing at least in part to the impedances of the layers 14, 15, and 16 of the first acoustic mirror 17, the first acoustic mirror 17 reflects at least portions of these acoustic vibrations in a direction that is not towards the substrate 13. As a result, the reflected portions of the acoustic waves do not reach the substrate 13. In this manner, the first acoustic mirror 17 isolates the vibrations produced by the vibrating piezoelectric layers from the substrate 13 within the respective filters 1, 1*a*, 2, 2*a*, 116, and 118.

Acoustic waves also propagate from each vibrating piezoelectric layer in a direction that is towards the second acoustic mirror 18. The second acoustic mirror 18 functions in a similar manner as the first acoustic mirror 17. More particularly, owing at least in part of the impedances of the layers 4, 5 and 6 that form the second acoustic mirror 18, the second acoustic mirror 18 reflects the acoustic vibrations in a direction that is not towards the protective passivation layer 3, nor in a direction that is towards the external contacts (e.g., 19*a* and 19*b*) for a case in which the BAW filter 2, the BAW filter 2*a*, or the SCF 118 is employed. As a result, the reflected acoustic waves do not reach these portions of the respective devices, and hence do not reach the interface between the second acoustic mirror 18 and the protective passivation layer 3. Also for the BAW filters 2 and 2*a*, and the SCF 118 of FIG. 13*d*, the second acoustic mirror 18 prevents the reflected acoustic waves from reaching the interfaces between the second acoustic mirror 18 and portions of the contacts (e.g., contacts 19*a* and 19*b*) located in the upper portion of the respective devices. As can be appreciated, in a case in which, by example, some material is placed upon or is otherwise in contact with the protective passivation layer 3 of either of the devices 1, 1*a*, 2, 2*a*, 116, and 118, the reflected portions of the acoustic waves do not reach the material. In this manner, the second acoustic mirror 18 isolates this material from acoustic vibrations produced by the piezoelectric layers.

Another advantage of employing the second acoustic mirror 18 is that the second acoustic mirror 18 covers substantially all of the resonators 7, 12, 7', and 12' of the BAW filters 1, 1*a*, 2, and 2*a*, and substantially all of the resonators 109 and 111 of the SCFs 116 and 118, and thus prevents solvents and the like from coming into contact with, and contaminating or otherwise harming, the layers of these devices. In that the second acoustic mirror 18 protects these layers in this manner, there is no need to provide other forms of protection for these layers, such as, by example, semi-hermetic packaging. Thus, costs associated with these other forms of protection are avoided, and the overall costs of fabricating the devices are considerably reduced. Moreover, being that the invention employs BAW filters instead of SAW resonator filters, and since protective packaging is not required to protect the BAW filters, it is not necessary to connect these filters to packaging pins via bonding wires, as is generally required to be done in cases wherein SAW filters are used. As a result, the BAW filters of the present invention can exhibit smaller parasitic components (e.g., parasitic capacitances) than filters (e.g., SAW filters) that require protective packaging. Furthermore, since no packaging is required to protect the BAW filters 1, 1*a*, 2, and 2*a* and the SCFs 116 and 118 of the invention, the overall sizes of these individual devices can be smaller than, for example, individual semi-hermetically packaged filters.

Another advantage offered by the various embodiments of the invention is that the second acoustic mirror is employed within BAW filters instead of within SAW filters, which require some form of hermetic packaging for protection. By example, if an acoustic mirror or reflector were employed in a SAW device, the acoustic mirror would need to include inter-digital metallization patterns disposed on a surface of the devices, as acoustic waves propagate within SAW filters in a direction that is parallel to the layer surfaces of the filters. Unfortunately, the presence of these inter-digital metallization patterns necessitates the use of hermetic packaged for protection in these SAW devices.

Figure 9:
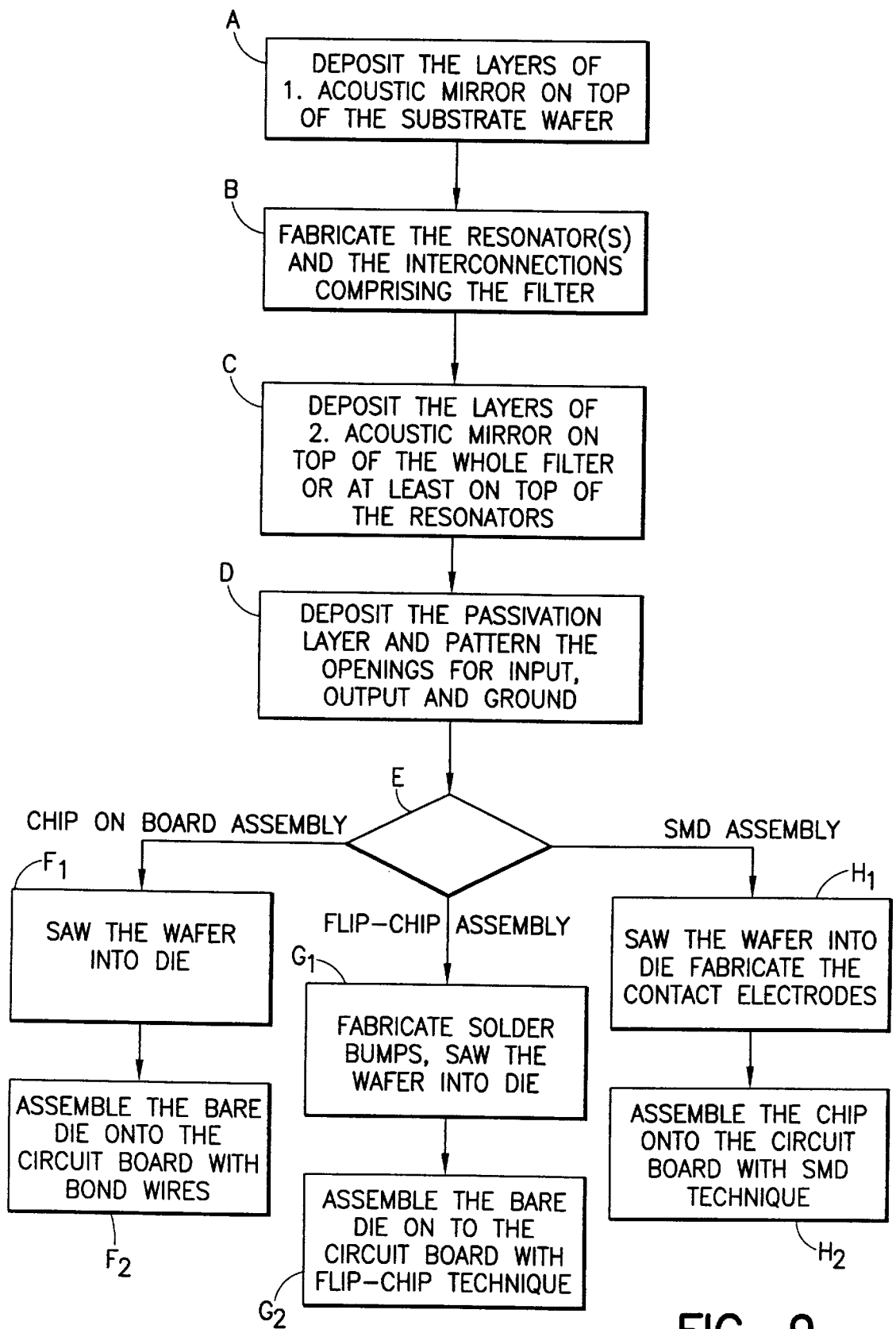
FIG. 9 illustrates a logic flow diagram of a method in accordance with the invention.

In accordance with another aspect of the invention, a method is provided for fabricating a BAW filter and assembling the filter on a circuit board. Referring to the logic flow diagram of FIG. 9, the method includes a step (A) of forming a first, lower acoustic mirror over a substrate. A next step (B) includes forming at least one resonator on the lower acoustic mirror. The at least one resonator may include one or more BAW resonators that are similar to those described above. By example, two or more resonators may be formed adjacent to one another on a top surface of the lower acoustic mirror. Also by example, a stack of resonators may be formed on the top surface of the lower acoustic mirror to form a stacked crystal structure. Contact pads may also be formed from portions of the resonator electrodes to provide input, output, and grounding pads.

As a next step (C), a second, upper acoustic mirror is formed over at least a substantial portion of the at least one resonator. The upper acoustic mirror may also be formed over other portions of the filter including, by example, a portion of the lower acoustic mirror. The step (C) includes the steps of forming a first, lower layer over the at least one resonator and over a portion of the lower acoustic mirror, forming a second, middle layer over the lower layer, and forming a third, upper layer over the middle layer. The lower, middle, and upper layers form the upper acoustic mirror which is similar to that described above. By example, the lower and upper layers include a material having a low acoustic impedance such as silicon, poly-silicon, aluminum, or a polymer material. Also by example, the middle layer includes a material having a high acoustic impedance such as gold, molybdenum, or tungsten.

The method further includes the steps of (D) forming a protective passivation layer over the upper layer of the upper acoustic mirror, and patterning the layers formed in steps (C) and (D) to create openings for the contact pads, if any are provided. The protective passivation layer and the contact pads are also similar to those described above. The upper acoustic mirror protects the resonator from being contacted by external materials that can harm the at least one resonator. As can be appreciated, more than one BAW filter may be fabricated on a wafer in accordance with these method steps.

Thereafter, the filter is assembled on a circuit board using an assembly technique selected at block (E). Where the assembly technique selected at block (E) is an on-board assembly technique, steps (F1) and (F2) are performed. In step (F1), the wafer is cut into chips. In step (F2), the chips are coupled to circuitry of a circuit board with bonding wires.

For a case in which the assembly technique selected at block (E) is flip-chip technology, steps (G1) and (G2) are performed. In step (G1), solder bumps are fabricated on contact pads of the filter using, by example, vacuum deposition (e.g., evaporation) of a bump metal or electrochemical plating of solder. The wafer is then cut into chips. Thereafter, at block (G2), the chips, are coupled to selected contacts of the circuit board using flip-chip technology.

For a case wherein the assembly technique selected at block (E) is surface mount technology, steps (H1) and (H2) are performed. In step (H1), the wafer is cut into chips and contacts are formed over portions of the filter. These contacts are similar to the contacts (e.g., contacts 19a and 19b) described above, and can be fabricated using, for example, a silver dipping technique similar to that used to fabricate terminations for conventional surface mount discrete components. Thereafter, at step (H2), the chips are coupled to selected circuit board contact pads using surface mount technology. As was described above, the upper acoustic mirror protects the at least one resonator from being contacted by external materials that can harm the resonator.

While the invention has been particularly shown and described with respect to preferred embodiments thereof, it will be understood by those skilled in the art that changes in form and details may be made therein without departing from the scope and spirit of the invention.

What is claimed is:

1. A Bulk Acoustic Wave (BAW) filter, said BAW filter comprising a plurality of adjacent resonator structures disposed over a substrate, and further comprising an acoustic mirror disposed over said plurality of adjacent resonator structures.

2. A BAW filter as set forth in claim 1, wherein said acoustic mirror comprises a plurality of layers.

3. A BAW filter as set forth in claim 2, wherein each of said plurality of layers has a thickness that is approximately equal to one-quarter wavelength.

4. A BAW filter as set forth in claim 1, wherein said acoustic mirror comprises a top layer that includes a material having a low acoustic impedance, a middle layer that includes a material having a high acoustic impedance, and a bottom layer that includes a material having a low acoustic impedance.

5. A BAW filter as set forth in claim 4, wherein said top and bottom layers comprise one of silicon, polysilicon, aluminum, and a polymer material, and wherein said middle layer comprises one of gold, molybdenum, and tungsten.

6. A BAW filter as set forth in claim 1, further comprising a protective passivation layer formed over said acoustic mirror.

7. A BAW filter as set forth in claim 6, wherein said protective passivation layer comprises one of epoxy, a glop top material, and silicon-dioxide, and has a thickness of at least 0.2 $\mu$m.

8. A BAW filter as set forth in claim 1, wherein at least one of said plurality of resonator structures includes at least one electrode having a portion which is exposed for providing a contact pad, said contact pad for coupling said at least one resonator structure to a wiring substrate via bonding wires.

9. A BAW filter as set forth in claim 1, wherein at least one of said plurality of resonator structures includes at least one electrode having a portion which is exposed for providing a contact pad, said contact pad for coupling said at least one resonator structure to a wiring substrate, using flip-chip technology.

10. A BAW filter as set forth in claim 1, wherein each of said plurality of resonator structures includes a plurality of electrodes, wherein a portion of a first one of said electrodes of a first one of said resonator structures is exposed for providing a first contact pad, and a portion of a first one of said electrodes of a second one of said resonator structures is exposed for providing a second contact pad, and wherein said BAW filter further comprises a third contact pad disposed over said substrate, said third contact pad being exposed and being electrically coupled to a first one of said electrodes of each of a third one and a fourth one of said resonator structures, and wherein said first, second, and third contact pads are for coupling respective ones of said first, second, and third resonator structures to a wiring substrate.

11. A BAW filter as set forth in claim 10, and further comprising a fourth contact pad disposed over said substrate, said fourth contact pad being exposed and being electrically coupled to said first one of said electrodes of each of said third and fourth resonator structures, said fourth contact pad for coupling said third and fourth resonator structures to a wiring substrate.

12. A BAW filter as set forth in claim 1, wherein each of said plurality of resonator structures includes at least two electrodes, said BAW filter further comprising a plurality of contacts disposed over an external surface of said BAW filter, individual ones of at least two of said contacts being electrically coupled to an electrode of a respective individual one of said resonator structures, said contacts for surface mounting said BAW filter to a wiring substrate.

13. A BAW filter as set forth in claim 1, wherein said acoustic mirror substantially isolates acoustic vibrations produced by said resonator structures from reaching beyond an upper surface of said acoustic mirror.

14. A BAW filter as set forth in claim 1, wherein said acoustic mirror protects said resonator structures by preventing environmental contaminants from coming into contact with said resonator structures.

15. A BAW filter as set forth in claim 1, wherein said acoustic mirror is an upper one of a pair of acoustic mirrors of said BAW filter, and wherein a lower one of said pair of acoustic mirrors is disposed between said substrate and said resonator structures.

16. A BAW filter as set forth in claim 15, wherein said lower acoustic mirror substantially prevents vibrations produced by said resonator structures from reaching said substrate, and wherein said upper acoustic mirror substantially prevents vibrations produced by said resonator structures from reaching an upper surface of said BAW filter.

17. A BAW filter as set forth in claim 1, wherein each of said resonator structures includes a plurality of electrodes, said BAW filter further comprising a plurality of contacts disposed over an external surface of said BAW filter, wherein a first one of said electrodes of a first one of said resonator structures is electrically coupled to a first one of said contacts, a first one of said electrodes of a second one of said resonator structures is electrically coupled to a second one of said contacts, a first one of said electrodes of a third one of said resonator structures is electrically coupled to a third one of said contacts, and a first one of said electrodes of a fourth one of said resonator structures is electrically coupled to said third contact.

18. A BAW filter as set forth in claim 17, wherein a second one of said electrodes of said first resonator structure is coupled to a second one of said electrodes of each of said second and third resonator structures, and wherein a second one of said electrodes of said fourth one of said resonator structures is coupled to said first electrode of said second resonator structure.

19. A BAW filter as set forth in claim 17, wherein said first electrodes of said third and fourth resonator structures are also electrically coupled to a fourth one of said contacts.

20. A Bulk Acoustic Wave (BAW) filter, comprising:
a substrate;
a first acoustic mirror disposed over said substrate;
a plurality of adjacent resonator structures disposed over at least a portion of said first acoustic mirror; and
a second acoustic mirror disposed over said plurality of adjacent resonator structures.

21. A BAW filter as set forth in claim 20, wherein at least one of said first and second acoustic mirrors comprises a top layer that includes a material having a low acoustic impedance, a middle layer that includes a material having a high acoustic impedance, and a bottom layer that includes a material having a low acoustic impedance.

22. A BAW filter as set forth in claim 21, wherein said top and bottom layers comprise one of silicon, poly-silicon, aluminum, and a polymer material, and wherein said middle layer comprises one of gold, molybdenum, and tungsten.

23. A BAW filter as set forth in claim 20, further comprising a protective passivation layer formed over said second acoustic mirror.

24. A BAW filter as set forth in claim 23, wherein said protective passivation layer comprises one of epoxy, a glop top material, and silicon-dioxide, and has a thickness of at least 0.2 $\mu$m.

25. A BAW filter as set forth in claim 20, wherein at least one of said resonator structures includes an electrode having a portion which is exposed for providing a contact pad, said contact pad for coupling said at least one resonator structure to a wiring substrate via bonding wires.

26. A BAW filter as set forth in claim 20, wherein at least one of said resonator structures includes an electrode having a portion which is exposed for providing a contact pad, said contact pad for coupling said at least one resonator structure to a wiring substrate, using flip-chip technology.

27. A BAW filter as set forth in claim 20, wherein each of said plurality of resonator structures includes a plurality of electrodes, wherein a portion of a first one of said electrodes of a first one of said resonator structures is exposed for providing a first contact pad, a portion of a first one of said electrodes of a second one of said resonator structures is exposed for providing a second contact pad, and wherein said BAW filter further comprises a third contact pad disposed over said substrate, said third contact pad being exposed and being electrically coupled to a first one of said electrodes of each of a third one and a fourth one of said resonator structures, and wherein said first, second, and third contact pads are for coupling respective ones of said first, second, and third resonator structures to a wiring substrate.

28. A BAW filter as set forth in claim 27, and further comprising a fourth exposed contact pad disposed over said substrate, said fourth contact pad being electrically coupled to said first one of said electrodes of each of said third and fourth resonator structures, said fourth contact pad for coupling said third and fourth resonator structures to a wiring substrate.

29. A BAW filter as set forth in claim 20, wherein each of said resonator structures includes at least two electrodes, said BAW filter further comprising a plurality of contacts disposed over an external surface of said BAW filter, individual ones of at least two of said contacts being electrically coupled to an electrode of respective individual ones of at least two of said resonator structures, said contacts for surface mounting said BAW filter to a wiring substrate.

30. A BAW filter as set forth in claim 20, wherein each of said resonator structures includes a plurality of electrodes, said BAW filter further comprising a plurality of contacts disposed over an external surface of said BAW filter, wherein a first one of said electrodes of a first one of said resonator structures is electrically coupled to a first one of said contacts, a first one of said electrodes of a second one of said resonator structures is electrically coupled to a second one of said contacts, a first one of said electrodes of a third one of said resonator structures is electrically coupled to a third one of said contacts, and a first one of said electrodes of a fourth one of said resonator structures is electrically coupled to said third contact.

31. A BAW filter as set forth in claim 30, wherein said first electrodes of said third and fourth resonator structures are also electrically coupled to a fourth one of said contacts.

32. A Bulk Acoustic Wave (BAW) filter, comprising:
a substrate;
a first acoustic mirror disposed over said substrate;
at least one resonator structure disposed over a portion of said first acoustic mirror; and
a second acoustic mirror disposed over said at least one resonator structure, wherein said at least one resonator structure includes a plurality of stacked resonators, thereby forming a stacked crystal filter structure.

33. A method of fabricating a BAW filter, comprising the steps of:
forming a first acoustic mirror over a substrate;
forming at least one resonator structure on the first acoustic mirror; and
forming a second acoustic mirror over at least a substantial portion of the at least one resonator structure, wherein the step of forming at least one resonator structure is performed by forming a plurality of adjacent resonators on the first acoustic mirror.

34. A method as set forth in claim 33, wherein the step of forming the second acoustic mirror includes the steps of:
forming a first layer over the plurality of adjacent resonators and over a portion of the first acoustic mirror, the first layer including a material having a low acoustic impedance;
forming a second layer over the first layer, the second layer including a material having a high acoustic impedance; and
forming a third layer over the second layer, the third layer including a material having a low acoustic impedance.

35. A method as set forth in claim 34, wherein the material having a low acoustic impedance includes one of silicon, poly-silicon, aluminum, and a polymer material, and wherein the material having a high acoustic impedance includes one of gold, molybdenum, and tungsten.

36. A method as set forth in claim 33, further comprising a step of forming a protective passivation layer over the second acoustic mirror.

37. A method as set forth in claim 33, wherein between the steps of forming the at least one resonator structure and forming the second acoustic mirror, a step is performed of forming contact pads on the first acoustic mirror.

38. A method as set forth in claim 37, and further comprising a step of coupling the BAW filter to a wiring substrate by coupling the contact pads to contacts of the wiring substrate.

39. A method as set forth in claim 33, further including a step of forming contacts over an external surface of the BAW filter.

40. A method as set forth in claim 39, and further comprising a step of surface mounting the BAW filter to a wiring substrate by coupling the contacts to contacts of the wiring substrate.

41. A surface mountable Bulk Acoustic Wave (BAW) device, comprising:
a substrate;
a plurality of adjacent BAW resonator structures;
a first acoustic isolator disposed between said substrate and said plurality of adjacent BAW resonator structures;
a second acoustic isolator disposed over said plurality of adjacent BAW resonator structures; and
a plurality of electrodes disposed over an external surface of said BAW device for surface mounting said device to a wiring substrate.

42. A surface mountable BAW device as set forth in claim 41, wherein said substrate comprises one of silicon (Si), silicon dioxide ($SiO_2$), gallium arsenide (GaAs), glass, or a ceramic material.

43. A surface mountable BAW device as set forth in claim 41, wherein said first acoustic isolator transforms an impedance of the substrate to a lower impedance level.

44. A Bulk Acoustic Wave (BAW) filter, said BAW filter comprising at least one resonator structure which is disposed over a substrate, and further comprising an acoustic mirror disposed over said at least one resonator structure, wherein said at least one resonator structure includes a plurality of stacked resonators.

45. A method of fabricating a BAW filter, comprising the steps of:
forming a first acoustic mirror over a substrate;
forming at least one resonator structure on the first acoustic mirror; and
forming a second acoustic mirror over at least a substantial portion of the at least one resonator structure, wherein the step of forming at least one resonator structure is performed by forming a stack of resonators to form a stacked crystal structure.

46. A surface mountable Bulk Acoustic Wave (BAW) device, comprising:
a substrate;
at least one BAW resonator structure;
a first acoustic isolator disposed between said substrate and said at least one BAW resonator structure;
a second acoustic isolator disposed over said at least one BAW resonator structure; and
a plurality of electrodes disposed over an external surface of said BAW device for surface mounting said device to a wiring substrate, wherein said resonator structure comprises a plurality of stacked resonators.

* * * * *